(12) United States Patent
Kim et al.

(10) Patent No.: US 12,009,342 B2
(45) Date of Patent: Jun. 11, 2024

(54) SEMICONDUCTOR PACKAGES

(71) Applicant: Samsung Electronics Co., Ltd., Suwon-si (KR)

(72) Inventors: Hyoungjoon Kim, Hwaseong-si (KR); Sunwon Kang, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 277 days.

(21) Appl. No.: 17/383,608

(22) Filed: Jul. 23, 2021

(65) Prior Publication Data

US 2022/0077110 A1 Mar. 10, 2022

(30) Foreign Application Priority Data

Sep. 4, 2020 (KR) .................. 10-2020-0112915

(51) Int. Cl.
*H01L 25/065* (2023.01)
*H01L 23/00* (2006.01)
*H01L 23/31* (2006.01)

(52) U.S. Cl.
CPC ...... *H01L 25/0655* (2013.01); *H01L 23/3121* (2013.01); *H01L 24/16* (2013.01); *H01L 24/32* (2013.01); *H01L 24/33* (2013.01); *H01L 24/48* (2013.01); *H01L 24/73* (2013.01); *H01L 25/0652* (2013.01); *H01L 2224/16225* (2013.01); *H01L 2224/32145* (2013.01); *H01L 2224/32225* (2013.01); *H01L 2224/33181* (2013.01); *H01L 2224/48225* (2013.01); *H01L 2224/73204* (2013.01); *H01L 2224/73215* (2013.01); *H01L 2224/73265* (2013.01)

(58) Field of Classification Search
CPC .. H01L 35/0655; H01L 23/3121; H01L 24/16
See application file for complete search history.

(56) References Cited

U.S. PATENT DOCUMENTS

| | | | |
|---|---|---|---|
| 8,183,677 | B2 | 5/2012 | Meyer-Berg |
| 8,810,024 | B2 | 8/2014 | Lin et al. |
| 9,064,879 | B2 | 6/2015 | Hung et al. |
| 2011/0316150 | A1 | 12/2011 | Ozawa |
| 2013/0249075 | A1 | 9/2013 | Tateiwa et al. |
| 2014/0091454 | A1 | 4/2014 | Lin et al. |

(Continued)

*Primary Examiner* — Errol V Fernandes
(74) *Attorney, Agent, or Firm* — Harness, Dickey & Pierce, P.L.C.

(57) ABSTRACT

A semiconductor package includes a substrate, first and second semiconductor chip structures on the substrate and spaced apart from each other in a first horizontal direction, a mold layer on the substrate and covering both the first and second semiconductor chip structures, and a supporting structure on the mold layer and distal from the upper surface of the substrate than both the first and second semiconductor chip structures in a vertical direction. The supporting structure includes first and second supporting portions, spaced apart from each other in a second horizontal direction that is perpendicular to the first horizontal direction and the vertical direction. Each of the first and second supporting portions has a bar shape or a linear shape extending in the first horizontal direction. At least one of the first supporting portion or the second supporting portion overlaps the first and second semiconductor chips in the vertical direction.

20 Claims, 28 Drawing Sheets

(56) References Cited

U.S. PATENT DOCUMENTS

| | | |
|---|---|---|
| 2014/0252647 A1 | 9/2014 | Huang et al. |
| 2016/0133579 A1* | 5/2016 | Akiba .................... H01L 24/94 |
| | | 257/659 |
| 2019/0131254 A1 | 5/2019 | Chen et al. |

* cited by examiner

SEMICONDUCTOR PACKAGES

CROSS-REFERENCE TO RELATED APPLICATIONS

This application claims benefit of priority to Korean Patent Application No. 10-2020-0112915 filed on Sep. 4, 2020 in the Korean Intellectual Property Office, the disclosure of which is incorporated herein by reference in its entirety.

BACKGROUND

The present inventive concepts relate to semiconductor packages.

Recently, there has been continuous demand for miniaturization and weight reduction of electronic components mounted on electronic products. In order to reduce the size and weight of the electronic components, volumes of semiconductor packages mounted thereon are becoming smaller.

SUMMARY

An aspect of the present inventive concepts is to provide semiconductor packages capable of maintaining reliability.

Another aspect of the present inventive concepts is to provide semiconductor packages including a supporting structure capable of controlling warpage.

According to some example embodiments of the inventive concepts, a semiconductor package may include a substrate, a first semiconductor chip structure on the substrate and a second semiconductor chip structure on the substrate, a mold layer on the substrate, and a supporting structure on the mold layer. The first semiconductor chip structure and the second semiconductor chip structure may be spaced apart from each other in a first horizontal direction that is parallel to an upper surface of the substrate. The mold layer may cover both the first semiconductor chip structure and the second semiconductor chip structure. The supporting structure may be distal from the upper surface of the substrate than both the first semiconductor chip structure and the second semiconductor chip structure in a vertical direction that is perpendicular to the upper surface of the substrate. The supporting structure may be in direct contact with the mold layer. The supporting structure may include a first supporting structure and a second supporting structure, wherein the first supporting structure and the second supporting structure are spaced apart from each other in the second horizontal direction that is parallel to the upper surface and further is perpendicular to the first horizontal direction. Each of the first supporting structure and the second supporting structure may have a first bar shape or a first linear shape extending in the first horizontal direction. At least one of the first supporting structure or the second supporting structure may overlap the first and second semiconductor chips in the vertical direction.

According to some example embodiments of the inventive concepts, a semiconductor package may include a substrate, one or more semiconductor chip structures on the substrate, a mold layer on the substrate and covering the one or more semiconductor chip structures, and a supporting structure contacting an upper surface of the mold layer. The supporting structure may be distal from the upper surface of the substrate than the one or more semiconductor chip structures in a vertical direction that is perpendicular to the upper surface of the substrate. The supporting structure may include a first supporting structure and a second supporting structure, wherein the first supporting structure and the second supporting structure extend in parallel to each other and are spaced apart from each other. Each of the first supporting structure and the second supporting structure may have a first bar shape or a first linear shape extending in a first horizontal direction that is parallel to the upper surface of the substrate. A length of each of the first supporting structure and the second supporting structure in the first horizontal direction may be a same length as a length of the mold layer in the first horizontal direction.

According to some example embodiments of the inventive concepts, a semiconductor package may include a substrate, a first semiconductor chip on the substrate and a second semiconductor chip on the substrate, a mold layer on the substrate, and a supporting structure overlapping both the first semiconductor chip structure and the second semiconductor chip structure in a vertical direction that is perpendicular to an upper surface of the substrate. The first semiconductor chip structure and the second semiconductor chip structure may be spaced apart from each other in a first horizontal direction is parallel to the upper surface of the substrate. The mold layer may cover both the first semiconductor chip structure and the second semiconductor chip structure. The supporting structure may be in direct contact with the mold layer. The supporting structure may include a first supporting structure having a first length in the first horizontal direction and a second length in a second horizontal direction, wherein the second length is less than the first length, wherein the second horizontal direction is perpendicular to both the first horizontal direction and the vertical direction. The second length of the first supporting structure in the second horizontal direction may be equal to or greater than about 10 μm. The second length of the first supporting structure in the second horizontal direction may be equal to or less than one-half of a length of the substrate in the second horizontal direction.

BRIEF DESCRIPTION OF THE DRAWINGS

The above and other aspects, features, and advantages of the present inventive concepts will be more clearly understood from the following detailed description, taken in conjunction with the accompanying drawings, in which.

DETAILED DESCRIPTION

Figure 1:
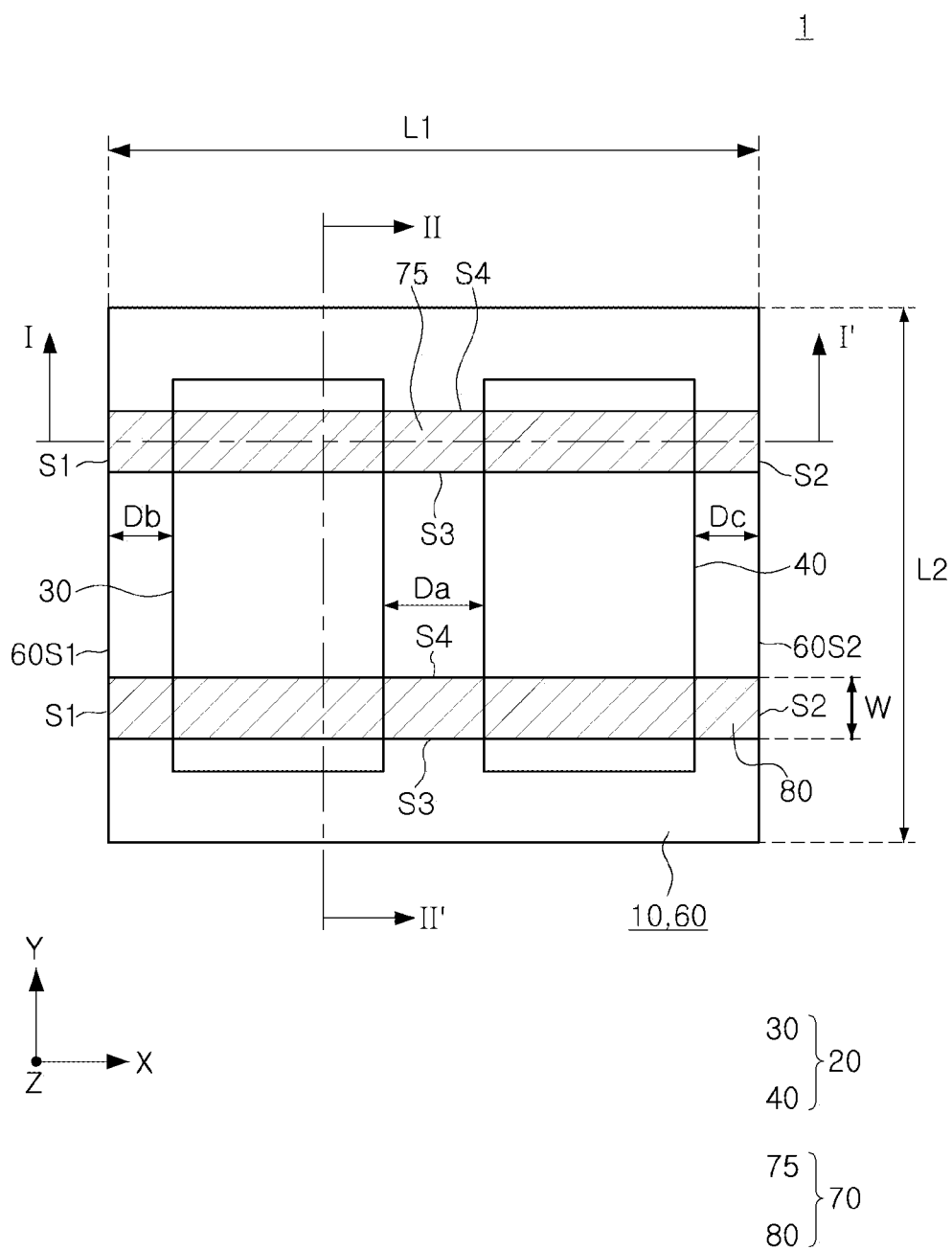
FIGS. 1, 2A, and 2B are views schematically illustrating examples of a semiconductor package according to some example embodiments of the present inventive concepts.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

An element (e.g., structure, surface, direction, etc.) described as being "in parallel" with another element may be interchangeably referred to as "extending in parallel" with the other element. An element (e.g., structure, surface, direction, etc.) described as being "perpendicular" to another element may be interchangeably referred to as "extending perpendicular" with the other element.

As described herein, an element that is "on" or "mounted on" another element may be above, beneath, and/or horizontally adjacent to the other element. Additionally, an element that is "on" another element may be directly on the other element such that the elements are in direct contact with each other or may be indirectly on the other element such that the elements are isolated from direct contact with each other.

Hereinafter, some example embodiments of the present inventive concepts will be described with reference to the accompanying drawings.

First, an example of a semiconductor package according to some example embodiments of the present inventive concepts will be described with reference to FIGS. 1, 2A, and 2B.

Figure 2A:
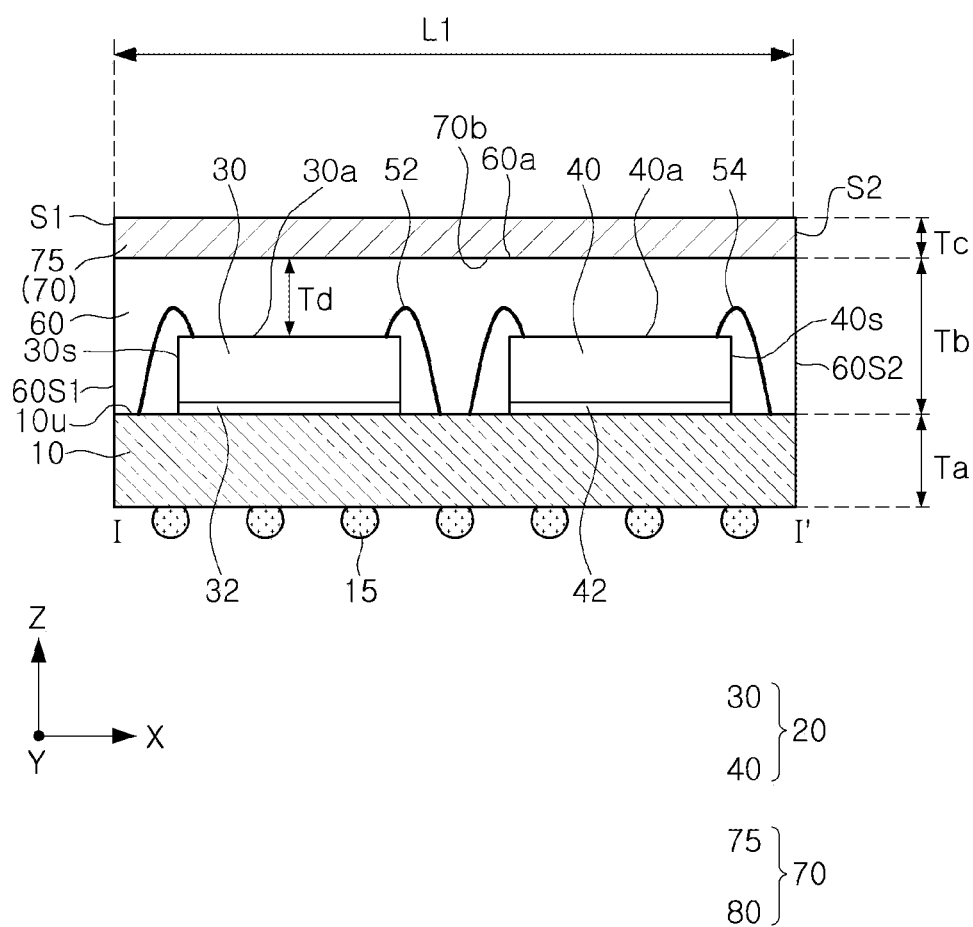
Figure 2B:
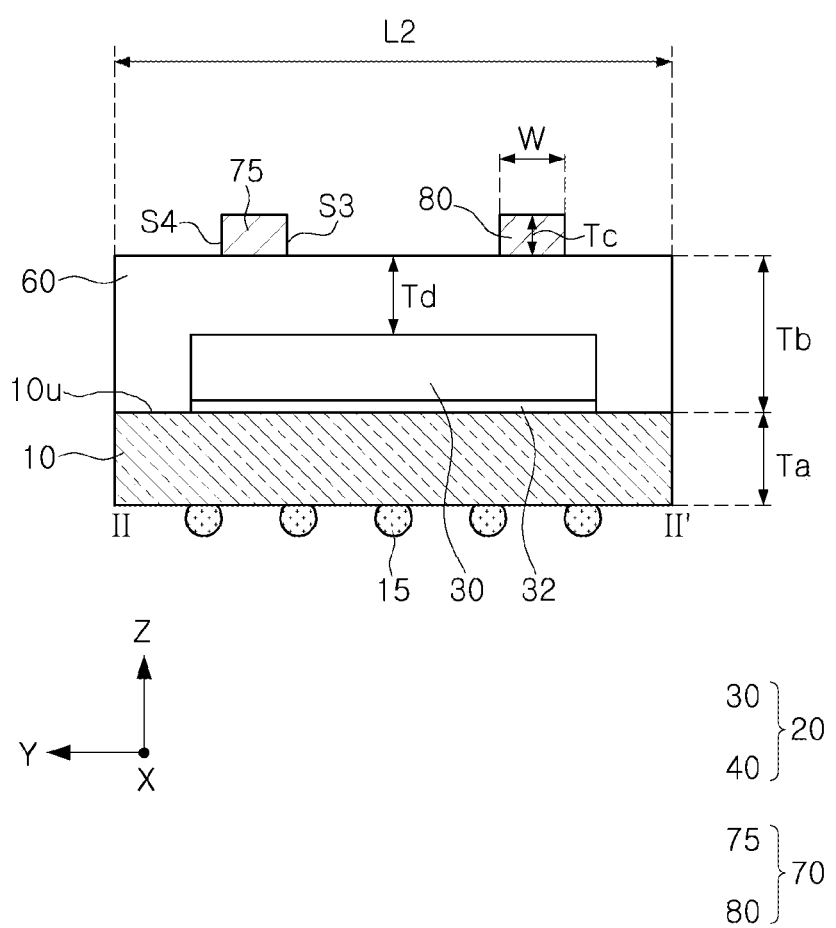

FIG. 1 is a plan view schematically illustrating an example of a semiconductor package according to some example embodiments of the present inventive concepts, FIG. 2A is a schematic cross-sectional view of FIG. 1 taken along line I-I', and FIG. 2B is a schematic cross-sectional view of FIG. 1 taken along line II-II'.

Referring to FIGS. 1, 2A, and 2B, a semiconductor package 1 according to some example embodiments may include a substrate 10, a plurality of semiconductor chip structures 20, a mold layer 60, and a supporting structure 70. The supporting structure 70 may be referred to as a reinforcing structure.

The plurality of semiconductor chip structures 20 may be disposed on the substrate 10. The plurality of semiconductor chip structures 20 may include a first semiconductor chip structure 30 and a second semiconductor chip structure 40, disposed on the substrate 10 and spaced apart from each other in a first horizontal direction X. Restated, the plurality of semiconductor chip structures 20 may include a first semiconductor chip structure 30 on the substrate 10 (e.g., directly or indirectly on the upper surface 10u of the substrate 10) and a second semiconductor chip structure 40, on the substrate 10 (e.g., directly or indirectly on the upper surface 10u of the substrate 10), where the first semiconductor chip structure 30 and the second semiconductor chip structure 40 are spaced apart from each other (e.g., isolated from direct contact with each other) in a first horizontal direction X that, as shown in at least FIG. 2A, extends in parallel with the upper surface 10u of the substrate 10. In some example embodiments, the semiconductor package 1 may include one or more semiconductor chip structures (e.g., a single semiconductor chip structure or a plurality of semiconductor chip structures 20) which may include a plurality of semiconductor chip structures 20 that are not isolated from direct contact with each other. The mold layer 60 may be disposed on (e.g., directly or indirectly on) the substrate 10 and may cover the plurality of semiconductor chip structures 20. For example, as shown in at least FIGS. 2A and 2B, the mold layer 60 may cover (e.g., directly contact and/or enclose) side surfaces 30s and 40s and upper surfaces 30a and 40a of the first and second semiconductor chip structures 30 and 40 on the substrate 10, in the X, Y, and Z axis directions above the upper surface 10u of the substrate 10 in the Z axis direction, and thus may cover (e.g., directly contact and/or enclose) both the first and second semiconductor chip structures 30 and 40. The supporting structure 70 may contact the mold layer 60 on a level higher than the one or more semiconductor chip structures, e.g., the plurality of semiconductor chip structures 20. For example, and as shown in at least FIGS. 2A and 2B, the supporting structure 70 that is on (e.g., directly on) the mold layer may directly contact the mold layer 60 (e.g., a lower surface 70b of the supporting structure 70 may directly contact an upper surface 60a of the mold layer 60), and the supporting structure 70 may be distal from the upper surface of the upper surface 10u of the substrate 10 in relation to the first and second semiconductor chip structures 30 and 40 in a vertical direction Z that extends perpendicular to the upper surface 10u of the substrate 10 (e.g., the lower surface 70b of the supporting structure 70 may be further from the upper surface 10u of the substrate 10 in the Y direction than the upper surfaces 30a and 40a of the first and second semiconductor chip structures 30 and 40).

In some example embodiments, the substrate 10 may be a package substrate such as a printed circuit board or the like. The substrate 10 is not limited to such a printed circuit board, and may have various forms, for example, a package substrate such as a redistribution substrate or the like. For example, the substrate 10 may include a package substrate body containing at least one material selected from a phenol resin, an epoxy resin, and polyimide, and copper (Cu), nickel (Ni), aluminum (Al), or beryllium copper, constituting a package substrate wiring for electrical signal connection within the body. For example, the substrate may contain FR4, a tetrafunctional epoxy resin, polyphenylene ether, epoxy/polyphenylene oxide, bismaleimide triazine (BT), Thermount, cyanate ester, polyimide, or a liquid crystal polymer.

In some example embodiments, the substrate 10 may include a material having a coefficient of thermal expansion (e.g., first coefficient of thermal expansion) of about 5 ppm/° C. to about 200 ppm/° C. before a glass transition temperature Tg, and a coefficient of thermal expansion (e.g., second coefficient of thermal expansion) of about 1 ppm/° C. to about 200 ppm/° C. after the glass transition temperature. The glass transition temperature of the material of the substrate 10 may range from about 150° C. to about 300° C.

In some example embodiments, a thickness Ta of the substrate 10 may be equal to or greater than about 60 μm, and may be equal to or less than about 250 μm.

In some example embodiments, the thickness Ta of the substrate 10 may be equal to or greater than about 80 μm, and may be equal to or less than about 230 μm.

In some example embodiments, at least one of the first or second semiconductor chip structure 30 or 40 may be a microprocessor, a graphic processor, a signal processor, a network processor, a chipset, an audio codec, a video codec, an application processor, or a system-on-chip, but are not limited thereto. For example, at least one of the first or second semiconductor chip structure 30 or 40 may be a memory chip such as a volatile memory chip, a non-volatile memory chip, or the like. For example, the volatile memory chip may include a dynamic random access memory (DRAM), a static RAM (SRAM), a thyristor RAM (TRAM), a zero capacitor RAM (ZRAM), or a twin transistor RAM (TTRAM). In addition, the non-volatile memory chip may include, for example, a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, a polymer RAM, a nano-floating gate memory, a holographic memory, a molecular electronics memory, or an insulator resistance change memory.

In some example embodiments, the first and second semiconductor chip structures 30 and 40 may include the same type of semiconductor chip.

In another example, the first and second semiconductor chip structures 30 and 40 may include different types of semiconductor chips. For example, the first semiconductor chip structure 30 may be a volatile memory chip and/or a non-volatile memory chip, and the second semiconductor chip structure 40 may be a control semiconductor chip for driving a memory chip.

In some example embodiments, the first semiconductor chip structure 30 may be a single semiconductor chip. The second semiconductor chip structure 40 may be a single semiconductor chip. Accordingly, and as shown in at least FIGS. 1-2B, at least one of the first semiconductor chip structure 30 or the second semiconductor chip structure 40 may be a single semiconductor chip.

In some example embodiments, the mold layer 60 may include a material having a coefficient of thermal expansion of about 5 ppm/° C. to about 200 ppm/° C. before a glass transition temperature Tg, and a coefficient of thermal expansion of about 1 ppm/° C. to about 200 ppm/° C. after the glass transition temperature. The glass transition temperature of the material of the mold layer 60 may range from about 100° C. to about 170° C.

In some example embodiments, the mold layer 60 may include an epoxy-based molding resin or a polyimide-based molding resin. For example, the mold layer 60 may include an epoxy molding compound (EMC) or a high-K epoxy molding compound.

In some example embodiments, a thickness Tb of the mold layer 60 may be equal to or greater than about 250 μm, and may be equal to or less than about 650 μm.

In some example embodiments, the thickness Tb of the mold layer 60 may be equal to or greater than about 300 μm, and may be equal to or less than about 600 μm.

In some example embodiments, when viewed in plan view, the mold layer 60 may have substantially the same size and substantially the same shape as the substrate 10. Therefore, the mold layer 60 and the substrate 10 may have lateral surfaces that may be aligned in a vertical direction Z.

In some example embodiments, a length L1 of the mold layer 60 in the first horizontal direction X (e.g., length between opposite lateral surfaces of the mold layer 60 in the first horizontal direction X) may be greater than a length L2 of the mold layer 60 in a second horizontal direction Y (e.g., length between opposite lateral surfaces of the mold layer 60 in the second horizontal direction Y). The second horizontal direction Y may be perpendicular to the first horizontal direction X.

In some example embodiments, at least one semiconductor chip structure of the first semiconductor chip structure 30 or the second semiconductor chip structure 40 may have a rectangular shape (e.g., a rectangular prism shape) in which a length of the at least one semiconductor chip structure in the second horizontal direction Y (e.g., length between opposite lateral surfaces of the at least one semiconductor chip structure in the second horizontal direction Y) is greater than a length of the at least one semiconductor chip structure in the first horizontal direction X (e.g., length between opposite lateral surfaces of the at least one semiconductor chip structure in the first horizontal direction X). In some example embodiments, and as shown in FIGS. 1-2B, the mold layer 60 may have an outer shape (e.g., a rectangular prism outer shape defined by outermost surfaces of the mold layer 60) wherein a length of the mold layer 60 in the first horizontal direction X is greater than a length of the mold layer 60 in the second horizontal direction Y.

In some example embodiments, a distance between upper surfaces of the plurality of semiconductor chip structures 20 and an upper surface of the mold layer 60, for example, a distance Td between an upper surface of the mold layer 60 and one or both of an upper surface (e.g., 30a) of the first semiconductor chip structure 30 and/or an upper surface (e.g., 40a) of the second semiconductor chip structure 40 may be equal to or greater than about 80 μm, and may be equal to or less than about 300 μm (e.g., equal to or greater than about 80 μm and equal to or less than about 300 μm).

The supporting structure 70 may control warpage of a structure including the substrate 10, the plurality of semiconductor chip structures 20, and the mold layer 60. For example, the supporting structure 70 may reduce or minimize or prevent warpage of a structure including the substrate 10, the plurality of semiconductor chip structures 20, and the mold layer 60. Therefore, since the supporting structure 70 may control deformation such as warpage of the semiconductor package 1, occurrence of package defects caused by excessive warpage of the semiconductor package 1 may be prevented.

In some example embodiments, the supporting structure 70 may include a metallic material. For example, the supporting structure 70 (e.g., the first supporting portion 75 and/or the second supporting portion 80) may include a copper material. In another example, the supporting structure 70 may include an aluminum material. In some example embodiments, the metallic material of the supporting structure 70 is not limited to copper or aluminum, but may be replaced with another metallic material.

In another example, the supporting structure 70 may include an insulating material. For example, the supporting structure 70 may include a polymer resin having a coefficient of thermal expansion different from a coefficient of thermal expansion of the mold layer 60. For example, the supporting structure 70 may include a polymer resin having a coefficient of thermal expansion less than a coefficient of thermal expansion of the mold layer 60. In another example, the supporting structure 70 may include a polymer resin having a coefficient of thermal expansion greater than a coefficient of thermal expansion of the mold layer 60.

In some example embodiments, the supporting structure 70 may include a material having an elastic modulus value of about 50 GPa to about 450 GPa, to reduce or minimize or prevent warpage of a structure including the substrate 10, the plurality of semiconductor chip structures 20, and the mold layer 60. When the elastic modulus value of the supporting structure 70 is less than about 50 GPa or greater than about 450 GPa, warpage of the semiconductor package 1 may occur more severely.

In some example embodiments, the supporting structure 70 may include a first supporting portion 75 and a second supporting portion 80, which may be parallel (e.g., may extend in parallel) to each other and spaced apart from each other (e.g., isolated from direct contact with each other). The first supporting portion 75 may be interchangeably referred to as a first supporting structure, and the second supporting portion 80 may be interchangeably referred to as a second supporting structure. As shown in at least FIG. 2B, the first and second supporting portions 75 and 80 may be isolated from direct contact with each other in at least a second horizontal direction Y that extends in parallel to the upper surface 10u of the substrate 10 and further extends perpendicular to the first horizontal direction X.

As shown in at least FIGS. 1-2B, each of the first and second supporting portions 75 and 80 may have a bar shape or a linear shape (e.g., a first bar shape or a first linear shape) extending in the first horizontal direction X. A bar shape and/or a linear shape may be a cuboid shape, including a rectangular prism shape, a trapezoid prism shape, a two-dimensional strip shape, or the like having a longest dimension extending in the first horizontal direction X.

As shown in at least FIGS. 1-2B, at least one of the first supporting portion 75 or the second supporting portion 80 may overlap at least one of the plurality of semiconductor chip structures 20 (e.g., one or both of the first and second semiconductor chip structures 30 and 40) in the vertical direction Z. For example, each of the first and second supporting portions 75 and 80 may overlap the first and second semiconductor chip structures 30 and 40 in the vertical direction Z. Thus, the supporting structure 70 may be understood to overlap both the first semiconductor chip structure 30 and the second semiconductor chip structure 40 in the vertical direction. As described herein, a structure that is described to "overlap" another structure (e.g., in the vertical direction Z) may at least partially overlap the other structure (e.g., in the vertical direction Z) or may completely overlap the other structure (e.g., in the vertical direction Z).

In some example embodiments, at least one of the first or second supporting portion 75 or 80 may have a first length (e.g., length L1) in the first horizontal direction X (e.g., length L1 between opposite lateral surfaces S1 and S2 in the first horizontal direction X) and a second length (e.g., width W) in the second horizontal direction Y (e.g., width W between opposite lateral surfaces S3 and S4 in the second horizontal direction Y) where the second length (e.g., width W) is less than the first length (e.g., length L1).

In some example embodiments, at least one of the first or second supporting portion 75 or 80, for example, a width W of the second supporting portion 80 (e.g., second length thereof in the second horizontal direction Y) may be equal to or greater than about 10 μm, and may be less than half (e.g., one-half) of a length L2 of the mold layer 60 in the second horizontal direction Y (where length L2 may be a length of the substrate 10 between opposite lateral surfaces thereof in the second horizontal direction Y).

In some example embodiments, at least one of the first or second supporting portion 75 or 80, for example, the width W of the second supporting portion 80 may be equal to or greater than about 10 μm, and may be less than ¼ of the length L2 of the mold layer 60 in the second horizontal direction Y.

In some example embodiments, to stably control the bending of the semiconductor package 1, a thickness Tc of the supporting structure 70, for example, each of the first and second supporting portions 75 and 80 may be equal to or greater than about 5 μm, and may be equal to or less than about 200 μm. For example, when the thickness Ta of the substrate 10 is about 60 μm to about 250 μm (e.g., equal to or greater than about 60 μm and equal to or less than about 250 μm), the thickness Tb of the mold layer 60 is about 250 μm to about 650 μm (e.g., equal to or greater than about 250 μm and equal to or less than about 650 μm), the distance Td in the vertical direction Z between the upper surface of the first semiconductor chip structure 30 and the upper surface of the mold layer 60 is about 80 μm to about 230 μm, and the thickness Tc of the supporting structure 70 is about 5 μm to about 200 μm, warpage of the semiconductor package 1 may be reduced or minimized, or stably controlled. As shown, the thickness Tc of the supporting structure 70 may be less than a thickness Tb of the mold layer 60. To more stably control warpage of the semiconductor package 1, the thickness Ta of the substrate 10 may be formed to range about 80 μm to about 230 μm, and the thickness Tb of the mold layer 60 may be formed to range about 300 μm to about 600 μm. It will be understood that, as described herein, a "thickness" may refer to a thickness in the vertical direction Z.

In some example embodiments, a length of each of the first and second supporting portions 75 and 80 and the length L1 of the mold layer 60 in the first horizontal direction X may be substantially the same. For example, as shown in at least FIG. 1, a length of each of the first and second supporting portions 75 and 80 in the first horizontal direction X (e.g., a length between opposite first and second lateral surfaces S1 and S2 of each of the first and second supporting portions 75 and 80 in the first horizontal direction X) may be the same or substantially the same as a length of the mold layer 60 in the first horizontal direction X (e.g., a length between opposite first and second lateral surfaces 60S1 and 60S2 of the mold layer 60 in the first horizontal direction X).

As shown in at least FIGS. 1-2B, in some example embodiments, each of the first and second supporting portions 75 and 80 may include a first lateral surface S1 and a second lateral surface S2, opposing each other (e.g., opposite to each other), and a third lateral surface S3 and a fourth lateral surface S4, opposing each other. It will be understood that said lateral surfaces that are "opposing each other" may refer to lateral surfaces that are "opposite to each other" such that said surfaces are on opposite sides of a structure. Surfaces that are opposite to each other may face in opposite directions away from each other. As shown in at least FIGS. 1-2B, each supporting portion of the first supporting portion 75 and the second supporting portion 80 may include a first lateral surface S1 and a second lateral surface S2 that are opposite lateral surfaces to each other and thus are on opposite sides of the supporting portion, and a third lateral surface S3 and a fourth lateral surface S4 that are opposite lateral surfaces to each other and thus are on opposite sides of the supporting portion. The first and second lateral surfaces S1 and S2 of each of the first and second supporting portions 75 and 80 may be parallel (e.g., may extend in parallel) to the second horizontal direction Y, and the third and fourth lateral surfaces S3 and S4 of each of the first and second supporting portions 75 and 80 may be parallel (e.g., may extend in parallel) to the first horizontal direction X. In each of the first and second supporting portions 75 and 80, the first lateral surface S1 and the second lateral surface S2 may be aligned with a portion of lateral surfaces of the mold layer 60 in the vertical direction Z. Restated, the first and second lateral surfaces S1 and S2 of the first and second supporting portions 75 and 80 may be each aligned (e.g., coplanar) with a portion of one or more lateral surfaces (e.g., 60S1 and/or 60S2) of the mold layer 60 in the vertical direction Z. For example, the mold layer 60 may include a first lateral surface 60S1 and a second lateral surface 60S2, opposing each other (e.g., opposite to each other so as to be on opposite sides of the mold layer 60). A portion of the first lateral surface 60S1 of the mold layer 60 may be aligned with (e.g., coplanar with) the first lateral surfaces S1 of both the first and second supporting portions 75 and 80 in the vertical direction Z. A portion of the second lateral surface 60S2 of the mold layer 60 may be aligned with the second lateral surfaces S2 of both the first and second supporting portions 75 and 80 in the vertical direction Z. It will be understood that surfaces described herein as being "aligned" with each other may be "coplanar" with each other. Among the first and second lateral surfaces 60S1 and 60S2 of the mold layer 60, the first lateral surface 60S1 of the mold layer 60 may be adjacent to the first semiconductor chip structure 30, and the second lateral surface 60S2 of the mold layer 60 may be adjacent to the second semiconductor chip structure 40. Restated, and as shown in at least FIGS. 1 and 2A the first lateral surface 60S1 of the mold layer 60 may be closer than the second lateral surface 60S2 of the mold layer 60 to the first semiconductor chip structure 30 (e.g., in the first horizontal direction X), and the second lateral surface 60S2 of the mold layer 60 may be closer than the first lateral surface 60S1 of the mold layer 60 to the second semiconductor chip structure 40 (e.g., in the first horizontal direction X).

As shown in at least FIGS. 1 and 2A, a distance Da between the first semiconductor chip structure 30 and the second semiconductor chip structure 40 in the first horizontal direction X may be greater than a distance Db between the first lateral surface 60S1 of the mold layer 60 and the first semiconductor chip structure 30 in the first horizontal direction X. The distance Da between the first semiconductor chip structure 30 and the second semiconductor chip structure 40 may be greater than a distance Dc between the second lateral surface 60S2 of the mold layer 60 and the second semiconductor chip structure 40.

A semiconductor package 1 according to some example embodiments may further include lower connection patterns 15 below the substrate 10. The lower connection patterns 15 may be solder balls.

A semiconductor package 1 according to some example embodiments may further include a first adhesive layer 32 bonding the first semiconductor chip structure 30 and the substrate 10, and a second adhesive layer 42 bonding the second semiconductor chip structure 40 and the substrate 10.

A semiconductor package 1 according to some example embodiments may further include a first connection structure 52 electrically connecting the first semiconductor chip structure 30 and the substrate 10, and a second connection structure 54 electrically connecting the second semiconductor chip structure 40 and the substrate 10. The first and second connection structures 52 and 54 may be bonding wires.

As described above, each of the first and second supporting portions 75 and 80 may include the third and fourth lateral surfaces S3 and S4, opposing each other. In each of the first and second supporting portions 75 and 80, the third and fourth lateral surfaces S3 and S4 may be substantially provided in the vertical direction. However, the technical idea of the present inventive concepts is not limited thereto, and the third and fourth lateral surfaces S3 and S4 may be modified to be inclined lateral surfaces. Hereinafter, a modified example of the third and fourth lateral surfaces S3 and S4 in each of the first and second supporting portions 75 and 80 will be described with reference to FIGS. 3A and 3B, respectively.

Figure 3A:
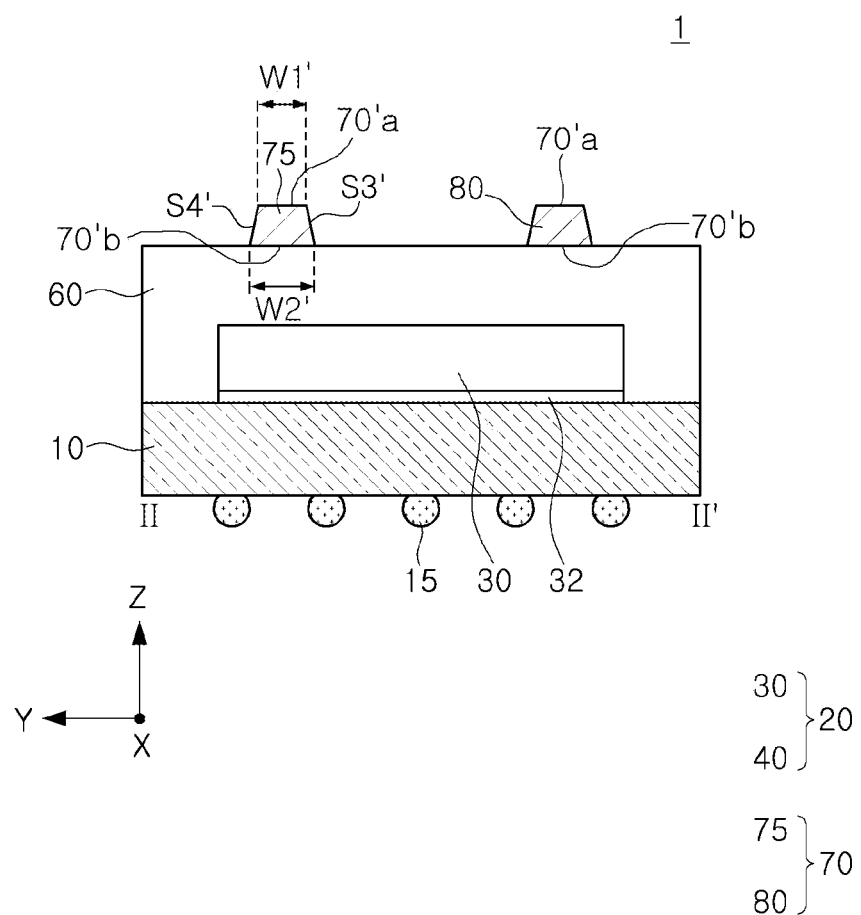
FIG. 3A is a cross-sectional view schematically illustrating a modified example of a semiconductor package according to some example embodiments of the present inventive concepts.
Figure 3B:
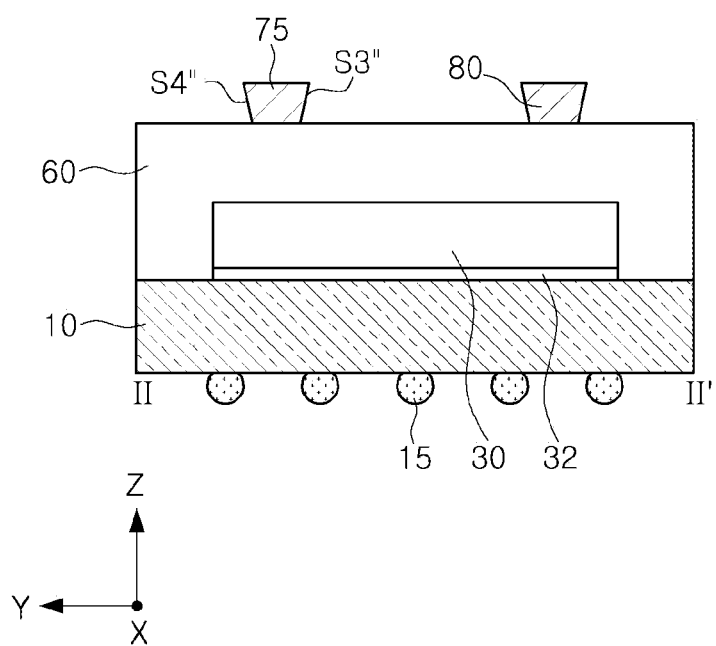
FIG. 3B is a cross-sectional view schematically illustrating a modified example of a semiconductor package according to some example embodiments of the present inventive concepts.

FIG. 3A is a cross-sectional view schematically illustrating FIG. 1, taken along line II-II', to explain a modified example of the third and fourth lateral surfaces S3 and S4 of each of the first and second supporting portions 75 and 80, and FIG. 3B is a cross-sectional view schematically illustrating FIG. 1, taken along line II-II', to explain a modified example of the third and fourth lateral surfaces S3 and S4 of each of the first and second supporting portions 75 and 80.

In some example embodiments, each of the first and second supporting portions 75 and 80 may include at least one inclined lateral surface. In a modified example, referring to FIG. 3A, first and second supporting portions 75 and 80 may include third and fourth lateral surfaces S3' and S4', having a positive slope, respectively (e.g., inclined lateral surfaces). For example, in a cross-sectional view cut in the second horizontal direction Y, each of the first and second supporting portions 75 and 80 may have a shape that gradually increases in width in a downward direction from top to bottom. Each of the first and second supporting portions 75 and 80 may include an upper surface 70'a having a first width W1' in the second horizontal direction Y and a lower surface 70'b having a second width W2' in the second horizontal direction Y, and the second width W2' may be greater than the first width W1'.

In a modified example, referring to FIG. 3B, first and second supporting portions 75 and 80 may include third and fourth lateral surfaces S3" and S4", having a negative slope, respectively. For example, in a cross-sectional view cut in the second horizontal direction Y, each of the first and second supporting portions 75 and 80 may have a shape that gradually decreases in width in a downward direction from top to bottom.

Again, referring to FIGS. 1, 2A, and 2B, in a semiconductor package 1 according to some example embodiments, the supporting structure 70 may be disposed on and in contact with an upper surface of the mold layer 60. However, the technical idea of the present inventive concepts is not limited thereto. Hereinafter, a modified example of the supporting structure 70 will be described with reference to FIGS. 4A and 4B, respectively.

Figure 4:
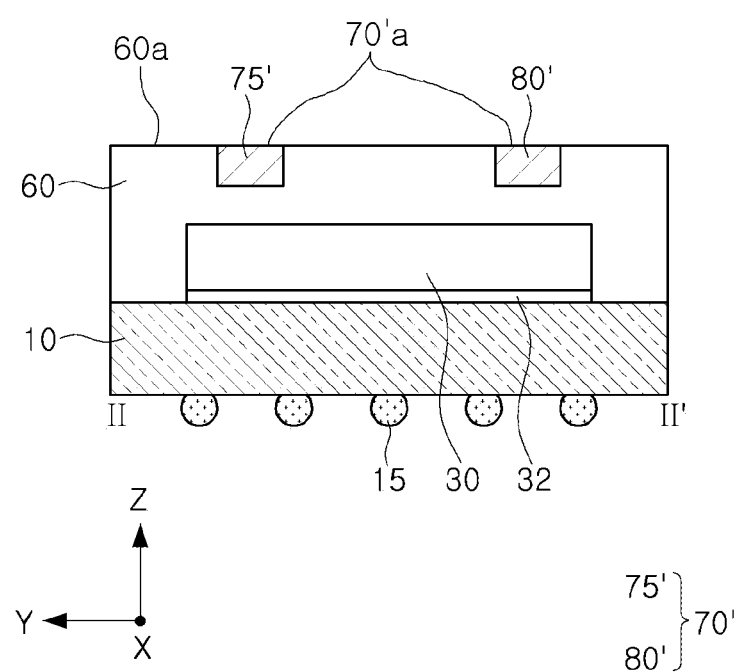
FIG. 4 is a cross-sectional view schematically illustrating a modified example of a semiconductor package according to some example embodiments of the present inventive concepts.
Figure 5:
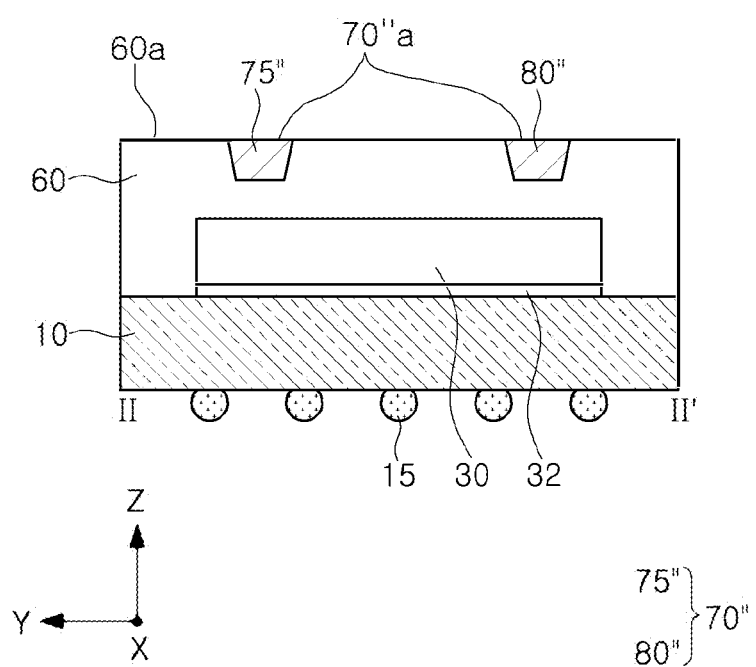
FIG. 5 is a cross-sectional view schematically illustrating a modified example of a semiconductor package according to some example embodiments of the present inventive concepts.

FIG. 4 is a cross-sectional view schematically illustrating FIG. 1, taken along line II-II', to explain a modified example of the supporting structure 70, and FIG. 5 is a cross-sectional view schematically illustrating FIG. 1, taken along line II-II', to explain a modified example of the supporting structure 70.

In a modified example, referring to FIG. 4, a supporting structure 70' may be embedded in a mold layer 60. For example, lateral surfaces and lower surfaces of first and second supporting portions 75' and 80' of the supporting structure 70' may be covered by the mold layer 60, respectively, and an upper surface 70'a of the supporting structure 70' may be coplanar with an upper surface 60a of the mold layer 60.

In a modified example, referring to FIG. 5, a supporting structure 70" may be embedded in a mold layer 60, and may have a shape that gradually decreases in width in a downward direction from top to bottom. Lateral surfaces and lower surfaces of first and second supporting portions 75" and 80" of the supporting structure 70" may be covered by the mold layer 60, respectively, and an upper surface 70"a of the supporting structure 70" may be coplanar with an upper surface 60a of the mold layer 60.

Referring again to FIGS. 1, 2A, and 2B, in a semiconductor package 1 according to some example embodiments, the first and second semiconductor chip structures 30 and 40 may be electrically connected to the substrate 10 by the connection structures 52 and 54 having a bonding wire structure. Hereinafter, a modified example of the electrical connection relationship between the first and second semiconductor chip structures 30 and 40 and the substrate 10 will be described with reference to FIG. 6A.

Figure 6A:
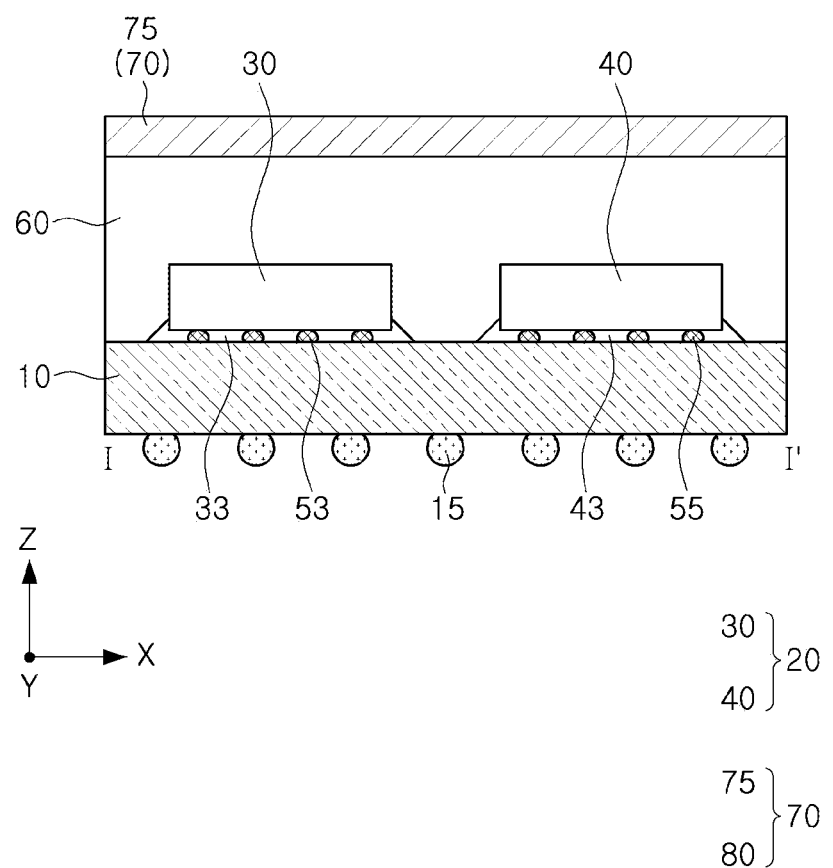
FIG. 6A is a cross-sectional view schematically illustrating a modified example of a semiconductor package according to some example embodiments of the present inventive concepts.

FIG. 6A is a cross-sectional view schematically illustrating FIG. 1, taken along line I-I', to explain a modified example of the electrical connection relationship between the first and second semiconductor chip structures 30 and 40 and the substrate 10.

In a modified example, referring to FIG. 6A, in a semiconductor package 1a, first and second semiconductor chip structures 30 and 40 may be electrically connected to a substrate 10 by conductive bumps 53 and 55, respectively. For example, the semiconductor package 1a may include first conductive bumps 53 disposed between a first semiconductor chip structure 30 and the substrate 10 and electrically connecting the first semiconductor chip structure 30 and the substrate 10, and second conductive bumps 55 disposed between a second semiconductor chip structure 40 and the substrate 10 and electrically connecting the second semiconductor chip structure 40 and the substrate 10.

In some example embodiments, the semiconductor package 1a may further include a first underfill material layer 33 filling between the first semiconductor chip structure 30 and the substrate 10 and surrounding lateral surfaces of the first conductive bumps 53, and a second underfill material layer 43 filling between the second semiconductor chip structure 40 and the substrate 10 and surrounding lateral surfaces of the second conductive bumps 55.

Referring again to FIGS. 1, 2A, and 2B, the plurality of semiconductor chip structures 20 may include the first semiconductor chip structure 30 and the second semiconductor chip structure 40, respectively, disposed on the substrate 10 and spaced apart from each other in the first horizontal direction X. In this case, the first semiconductor chip structure 30 may be a single semiconductor chip, and the second semiconductor chip structure 40 may be a single semiconductor chip. However, the technical idea of the present inventive concepts is not limited thereto. As shown in at least FIG. 6A, at least one of the first or second semiconductor chip structure 30 or 40 may be a plurality of stack chips stacked in the vertical direction Z. Hereinafter, referring to FIGS. 6B to 6F, at least one of the first or second semiconductor chip structure 30 or 40 may be a multilayer chip structure including a plurality of semiconductor chips stacked in the vertical direction Z. FIGS. 6B to 6F are cross-sectional views schematically illustrating FIG. 1, taken along line I-I', to explain examples of a stacked chip structure including the plurality of semiconductor chips in which at least one of the first or second semiconductor chip structure 30 or 40 in FIG. 2A is stacked in the vertical direction Z. In the following description with reference to FIGS. 6B to 6F, the examples of the stacked chip structure including the plurality of semiconductor chips in which at least one of the first or second semiconductor chip structure 30 or 40 in FIG. 2A is stacked in the vertical direction Z will be mainly described, and a description of the remaining components, for example, components such as the supporting structure 70 or the like will be omitted. In addition, in the stacked chip structure, the number of semiconductor chips to be stacked is not limited to that illustrated in the drawings, and may be greater than the number of stack chips illustrated in the drawings. As shown in at least FIGS. 6B-6F, at least one of the first semiconductor chip structure 30 or the second semiconductor chip structure 40 may be a stacked chip structure including a plurality of semiconductor chips that are stacked in the vertical direction Z.

As described herein, a semiconductor chip may be referred to interchangeably as a semiconductor chip structure.

Figure 6B:
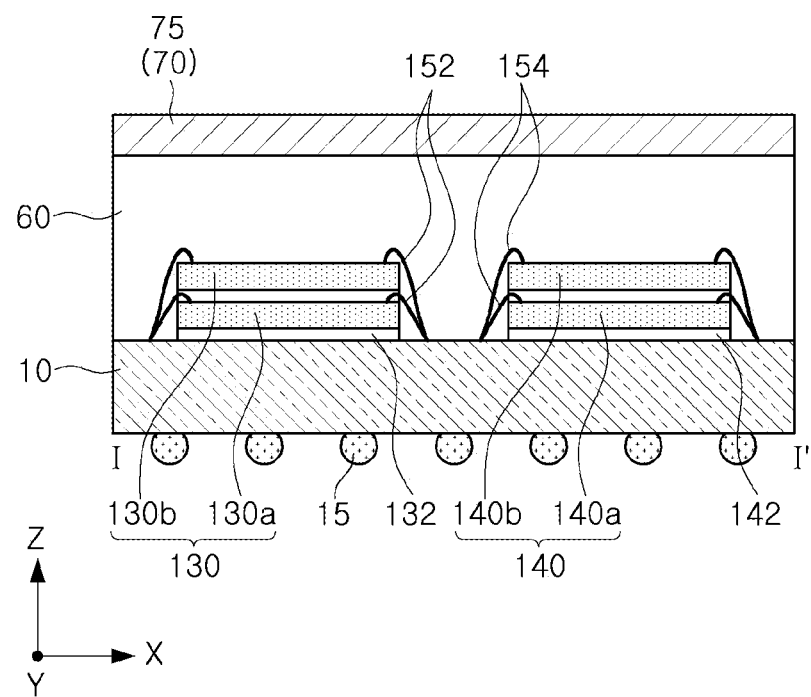
FIG. 6B is a cross-sectional view schematically illustrating a modified example of a semiconductor package according to some example embodiments of the present inventive concepts.

FIG. 6B is a cross-sectional view schematically illustrating FIG. 1, taken along line I-I', to explain a modified example of the electrical connection relationship between the first and second semiconductor chip structures 30 and 40 and the substrate 10.

In a modified example, referring to FIG. 6B, the first semiconductor chip structure 30 and the second semiconductor chip structure 40 in FIG. 2A may be replaced with a first stacked chip structure 130 including a plurality of first semiconductor chips 130a and 130b sequentially stacked in the vertical direction Z and vertically aligned, and a second stacked chip structure 140 including a plurality of second semiconductor chips 140a and 140b sequentially stacked in the vertical direction Z and vertically aligned, respectively. A first non-conductive film 132 may be disposed below each of the plurality of first semiconductor chips 130a and 130b. A second non-conductive film 142 may be disposed below each of the plurality of second semiconductor chips 140a and 140b. The first and second non-conductive films 132 and 142 may include an adhesive resin layer such as a silver direct adhesive film (DAF) or a film over wire (FOW). For example, the adhesive resin layer may include a bisphenol type epoxy resin, a no block type epoxy resin, a phenol resin, a urea resin, a melamine resin, an unsaturated polyester resin, and a resorcinol resin, and combinations thereof.

First connection structures 152 having a bonding wire structure electrically connecting the plurality of first semiconductor chips 130a and 130b to a substrate 10, and second connection structures 154 having a bonding wire structure electrically connecting the plurality of second semiconductor chips 140a and 140b to the substrate 10 may be disposed.

Figure 6C:
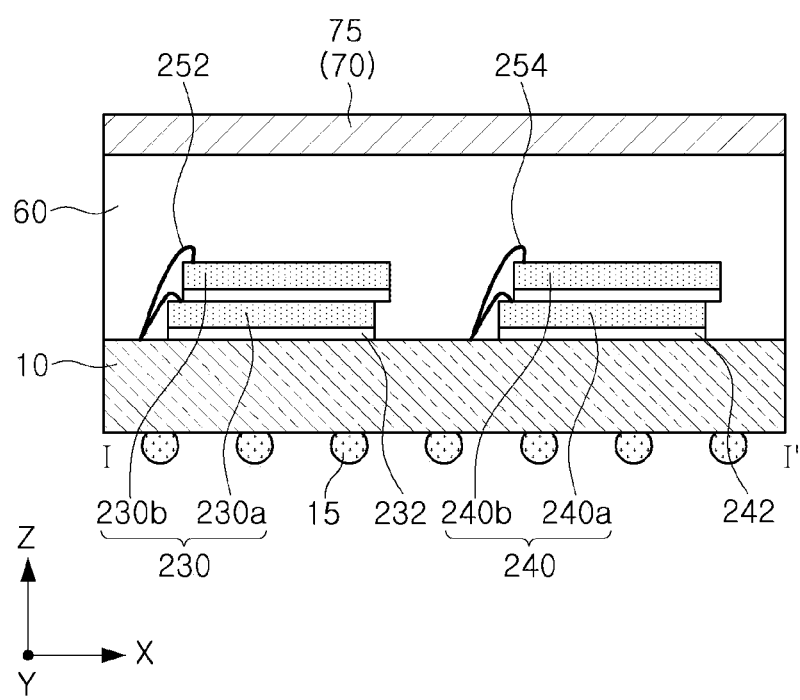
FIG. 6C is a cross-sectional view schematically illustrating a modified example of a semiconductor package according to some example embodiments of the present inventive concepts.

FIG. 6C is a cross-sectional view schematically illustrating FIG. 1, taken along line I-I', to explain a modified example of the electrical connection relationship between the first and second semiconductor chip structures 30 and 40 and the substrate 10.

In a modified example, referring to FIG. 6C, the first semiconductor chip structure 30 and the second semiconductor chip structure 40 in FIG. 2A may be replaced with a first stacked chip structure 230 including a plurality of first semiconductor chips 230a and 230b sequentially stacked in the vertical direction Z and having lateral surfaces not vertically aligned, and a second stacked chip structure 240 including a plurality of second semiconductor chips 240a and 240b sequentially stacked in the vertical direction Z, respectively. The plurality of first semiconductor chips 230a and 230b may be stacked in the vertical direction Z while being shifted in any one direction. The plurality of second semiconductor chips 240a and 240b may be stacked in the vertical direction Z while being shifted in any one horizontal direction. For example, among the plurality of first semiconductor chips 230a and 230b adjacent to each other, the first semiconductor chip 230b located relatively in an upward direction may partially overlap the second semiconductor chip 230a located relatively in an downward direction.

A first non-conductive film 232 may be disposed below each of the plurality of first semiconductor chips 230a and 230b. A second non-conductive film 242 may be disposed below each of the plurality of second semiconductor chips 240a and 240b. First connection structures 252 having a bonding wire structure electrically connecting the plurality of first semiconductor chips 230a and 230b to a substrate 10, and second connection structures 254 having a bonding wire structure electrically connecting the plurality of second semiconductor chips 240a and 240b to the substrate 10 may be disposed.

Figure 6D:
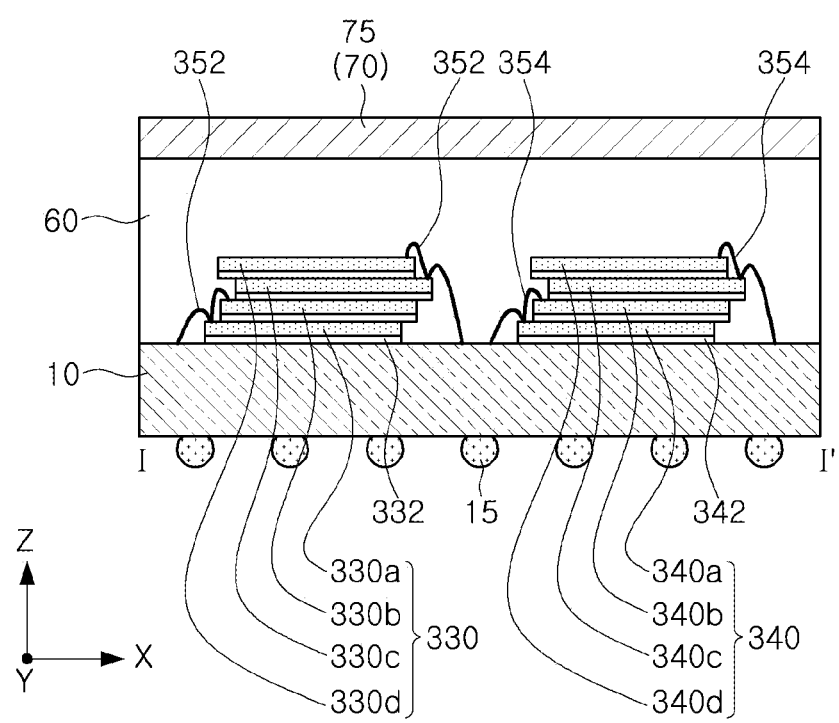
FIG. 6D is a cross-sectional view schematically illustrating a modified example of a semiconductor package according to some example embodiments of the present inventive concepts.

FIG. 6D is a cross-sectional view schematically illustrating FIG. 1, taken along line I-I', to explain a modified example of the electrical connection relationship between the first and second semiconductor chip structures 30 and 40 and the substrate 10.

In a modified example, referring to FIG. 6D, the first semiconductor chip structure 30 and the second semiconductor chip structure 40 in FIG. 2A may be replaced with a first stacked chip structure 330 including a plurality of first semiconductor chips 330a, 330b, 330c, and 330d sequentially stacked in the vertical direction Z, and a second stacked chip structure 340 including a plurality of second semiconductor chips 340a, 340b, 340c, and 340d sequentially stacked in the vertical direction Z, respectively. A first non-conductive film 332 may be disposed below each of the plurality of first semiconductor chips 330a, 330b, 330c, and 330d. A second non-conductive film 342 may be disposed below each of the plurality of second semiconductor chips 340a, 340b, 340c, and 340d. First connection structures 352 having a bonding wire structure electrically connecting the plurality of first semiconductor chips 330a, 330b, 330c, and 330d to a substrate 10, and second connection structures 354 having a bonding wire structure electrically connecting the plurality of second semiconductor chips 340a, 340b, 340c, and 340d to the substrate 10 may be disposed.

The plurality of first semiconductor chips 330a, 330b, 330c, and 330d may include first semiconductor chips 330a, 330b, and 330c stacked in the vertical direction Z while being shifted in one direction, and a first semiconductor chip 330d stacked in the vertical direction Z while being shifted in a direction, different from the one direction, for example, in an opposite direction. Similarly, the plurality of second semiconductor chips 340a, 340b, 340c, and 340d may include second semiconductor chips 340a, 340b, and 340c stacked in the vertical direction Z while being shifted in one direction, and a second semiconductor chip 340d stacked in the vertical direction Z while being shifted in a direction, different from the one direction, for example, in an opposite direction.

Figure 6E:
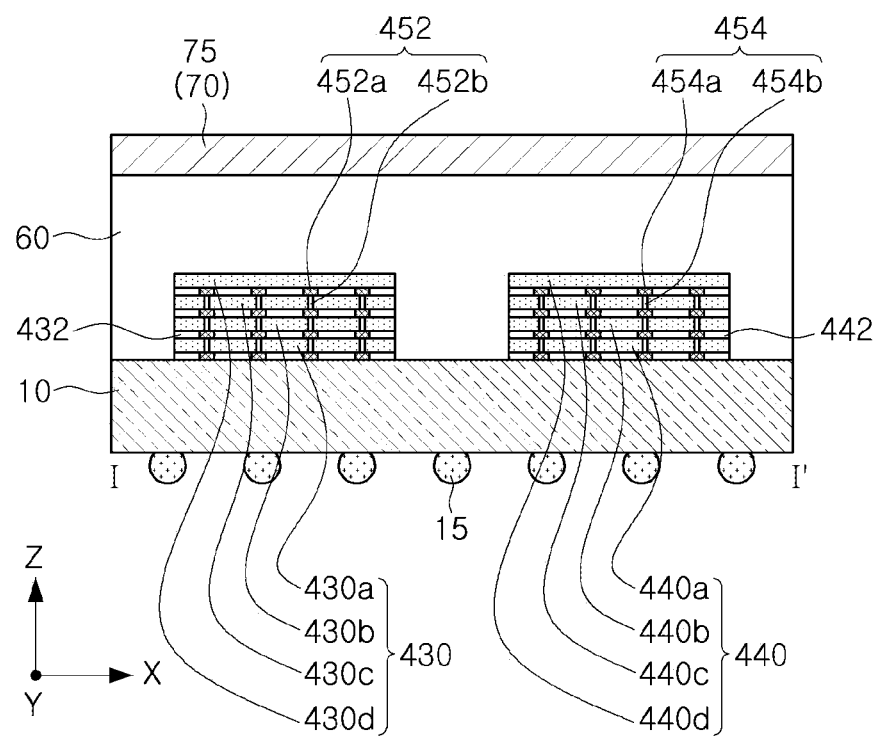
FIG. 6E is a cross-sectional view schematically illustrating a modified example of a semiconductor package according to some example embodiments of the present inventive concepts.

FIG. 6E is a cross-sectional view schematically illustrating FIG. 1, taken along line I-I', to explain a modified example of the electrical connection relationship between the first and second semiconductor chip structures 30 and 40 and the substrate 10.

In a modified example, referring to FIG. 6E, the first semiconductor chip structure 30 and the second semiconductor chip structure 40 in FIG. 2A may be replaced with a first stacked chip structure 430 including a plurality of first semiconductor chips 430a, 430b, 430c, and 430d sequentially stacked in the vertical direction Z, and a second stacked chip structure 440 including a plurality of second semiconductor chips 440a, 440b, 440c, and 440d sequentially stacked in the vertical direction Z. A first non-conductive film 432 may be disposed below each of the plurality of first semiconductor chips 430a, 430b, 430c, and 430d. A second non-conductive film 442 may be disposed below each of the plurality of second semiconductor chips 440a, 440b, 440c, and 440d.

The first stacked chip structure 430 may further include first conductive bumps 452a disposed below each of the plurality of first semiconductor chips 430a, 430b, 430c, and 430d, and first through-electrodes 452b respectively passing through remaining first semiconductor chips 430a, 430b, and 430c except for an uppermost first semiconductor chip 430d, among the plurality of first semiconductor chips 430a, 430b, 430c, and 430d. The second stacked chip structure 440 may further include second conductive bumps 454a disposed below each of the plurality of second semiconductor chips 440a, 440b, 440c, and 440d, and second through-electrodes 454b respectively passing through remaining second semiconductor chips 440a, 440b, and 440c except for an uppermost second semiconductor chip 440d, among the plurality of second semiconductor chips 440a, 440b, 440c, and 440d. The first conductive bumps 452a and the first through-electrodes 452b may collectively define first connection structures 452. The second conductive bumps 454a and the second through-electrodes 454b may collectively define second connection structures 454.

Figure 6F:
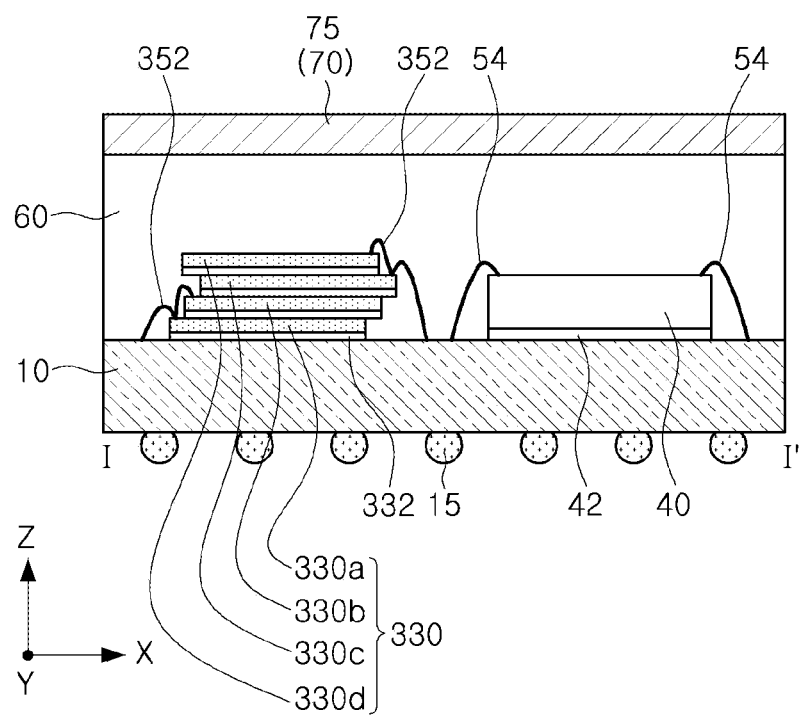
FIG. 6F is a cross-sectional view schematically illustrating a modified example of a semiconductor package according to some example embodiments of the present inventive concepts.

FIG. 6F is a cross-sectional view schematically illustrating FIG. 1, taken along line I-I', to explain a modified example of the electrical connection relationship between the first and second semiconductor chip structures 30 and 40 and the substrate 10.

In a modified example, referring to FIG. 6F, at least one of the first semiconductor chip structure 30 or the second semiconductor chip structure 40 in FIG. 2A may be replaced with any one of the first stacked chip structures 130, 230, 330, and 430 described in FIGS. 6B, 6C, 6D, and 6E. For example, the first semiconductor chip structure 30 in FIG. 2A may be replaced with any one of the first stacked chip structures 130, 230, 330, and 430 described in FIGS. 6B, 6C, 6D, and 6E. The second semiconductor chip structure 40 in FIG. 2A may be a single semiconductor chip. For example, the first semiconductor chip structure 30 in FIG. 2A may be replaced with the first stacked chip structure 330 described in FIG. 6D. Therefore, the first stacked chip structure 330 and the second semiconductor chip structure 40 as described in FIG. 6D may be disposed on a substrate 10.

In another example, the first semiconductor chip structure 30 in FIG. 2A may be replaced with any one of the first stacked chip structures 130, 230, 330, and 430 described in FIGS. 6B, 6C, 6D, and 6E. The second semiconductor chip structure 40 in FIG. 2A may be replaced with any one of the second stacked chip structures 140, 240, 340, and 440 as described in FIGS. 6B, 6C, 6D, and 6E. In this case, any one of the first stacked chip structures 130, 230, 330, and 430 replacing the first semiconductor chip structure 30 and any one of the second stacked chip structures 140, 240, 340, and 440 replacing the second semiconductor chip structure 40 may have different stacked chip structures.

Therefore, the first stacked chip structure 330 and the second semiconductor chip structure 40, illustrated in FIG. 6F, may indicate different types of semiconductor chips disposed on the substrate 10, and, as described above, the different types of semiconductor chips disposed on the substrate 10 may be any one of the first semiconductor chip structure 30 and the first stacked chip structures 130, 230, 330, and 430, and any one of the second semiconductor chip structure 40 and the second stacked chip structures 140, 240, 340, and 440, described in FIGS. 2A, 6B, 6C, 6D, and 6E.

Next, various modified examples of the supporting structure 70 in FIG. 1 will be described with reference to FIGS. 7A to 7D, respectively. Each of FIGS. 7A to 7D is a plan view illustrating various modified examples of the supporting structure 70 in FIG. 1.

Figure 7A:
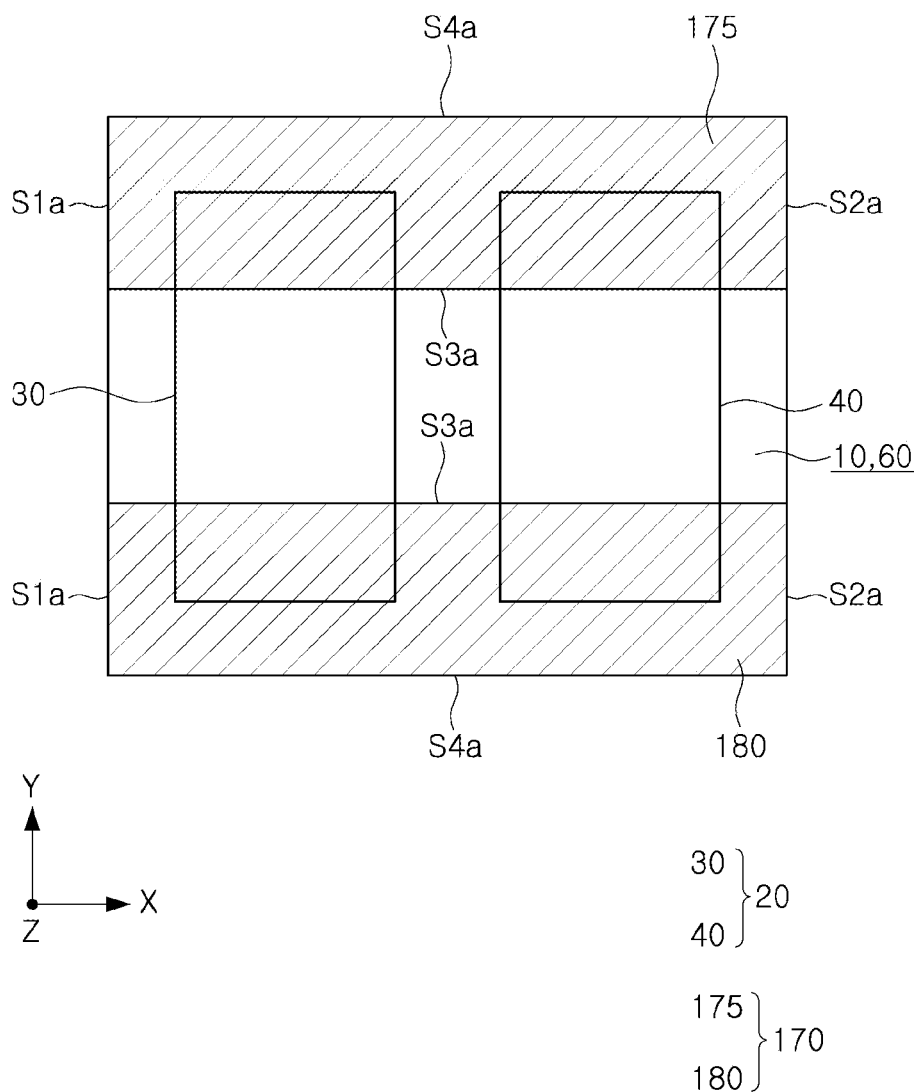
FIG. 7A is a plan view schematically illustrating a modified example of a semiconductor package according to some example embodiments of the present inventive concepts.

FIG. 7A is a plan view schematically illustrating a modified example of a semiconductor package according to some example embodiments of the present inventive concepts.

In a modified example, referring to FIG. 7A, a supporting structure 170 may include a first supporting portion 175 and a second supporting portion 180, parallel to each other. Each of the first and second supporting portions 175 and 180 may include first and second lateral surfaces S1a and S2a opposing each other, and the third and fourth lateral surfaces S3a and S4a opposing each other. In this case, in each of the first and second supporting portions 175 and 180, the first and second lateral surfaces S1a and S2a may be lateral surfaces located in end portions thereof in a length direction of each of the first and second supporting portions 175 and 180, for example, in the first horizontal direction X, and the third and fourth lateral surfaces S3a and S4a may be lateral surfaces located in end portions thereof in a width direction of each of the first and second supporting portions 175 and 180, for example, in the second horizontal direction Y.

In each of the first and second supporting portions 175 and 180, the first and second lateral surfaces S1a and S2a, and the fourth lateral surface S4a may be vertically aligned with lateral surfaces of a mold layer 60. The third lateral surface S3a of the first supporting portion 175 and the third lateral surface S3a of the second supporting portion 180 may oppose each other, and may be spaced apart from each other.

Figure 7B:
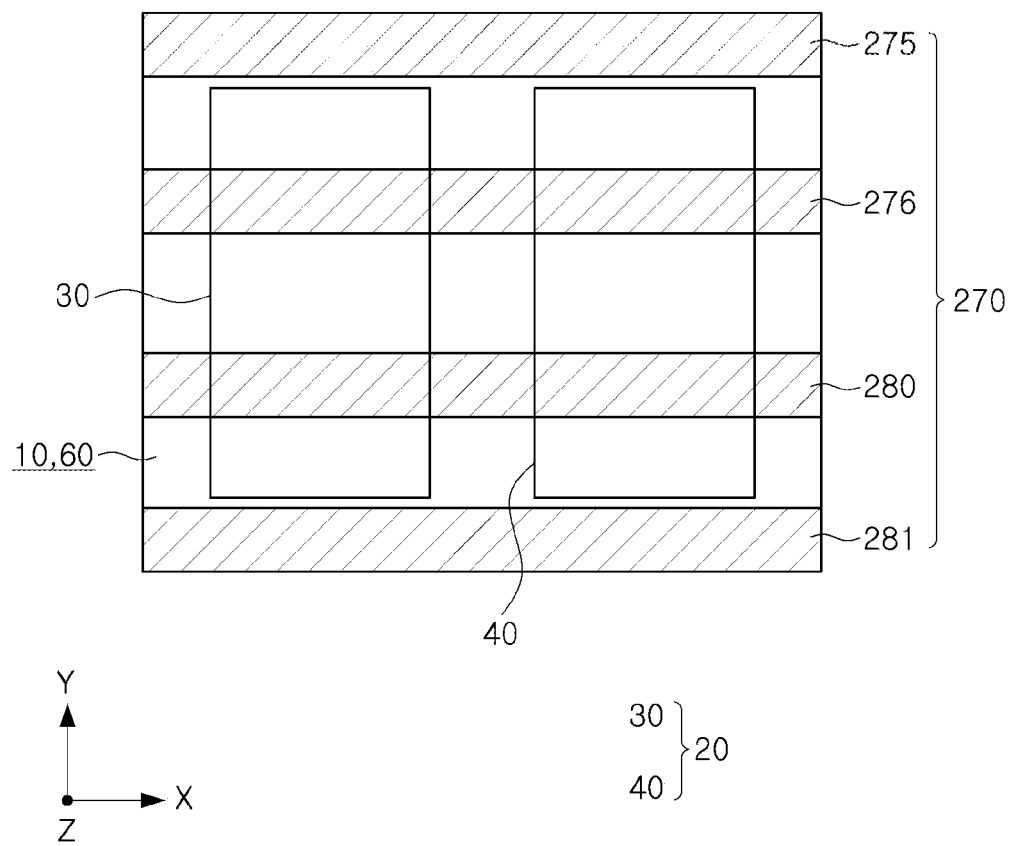
FIG. 7B is a plan view schematically illustrating a modified example of a semiconductor package according to some example embodiments of the present inventive concepts.

FIG. 7B is a plan view schematically illustrating a modified example of a semiconductor package according to some example embodiments of the present inventive concepts.

In a modified example, referring to FIG. 7B, a supporting structure 270 may include one or more additional (e.g., third) supporting portions in addition to first and second supporting portions. For example, as shown in at least FIG. 7B, a supporting structure 270 may include a first supporting portion 275, a second supporting portion 276, a third supporting portion 280, and a fourth supporting portion 281, parallel (e.g., extending in parallel) to each other and which each may have a bar shape or a linear shape. In some example embodiments, the first and second supporting portions 275 and 276 may each have a first bar shape or a first linear shape extending in a first horizontal direction X, and the third and second supporting portions 280 and 281 may each have a second bar shape or a second linear shape extending in a second horizontal direction Y. The first and second bar shapes may be same or different bar shapes. The first and second linear shapes may be same or different linear shapes. For example, the first to fourth supporting portions 275, 276, 280, and 281 may include second and third supporting portions 276 and 280, intersecting upper surfaces of the first and second semiconductor chip structures 30 and 40, The first and fourth supporting portions 275 and 281 including lateral surfaces aligned with edges located in end portions of a mold layer 60 in the second horizontal direction Y.

Figure 7C:
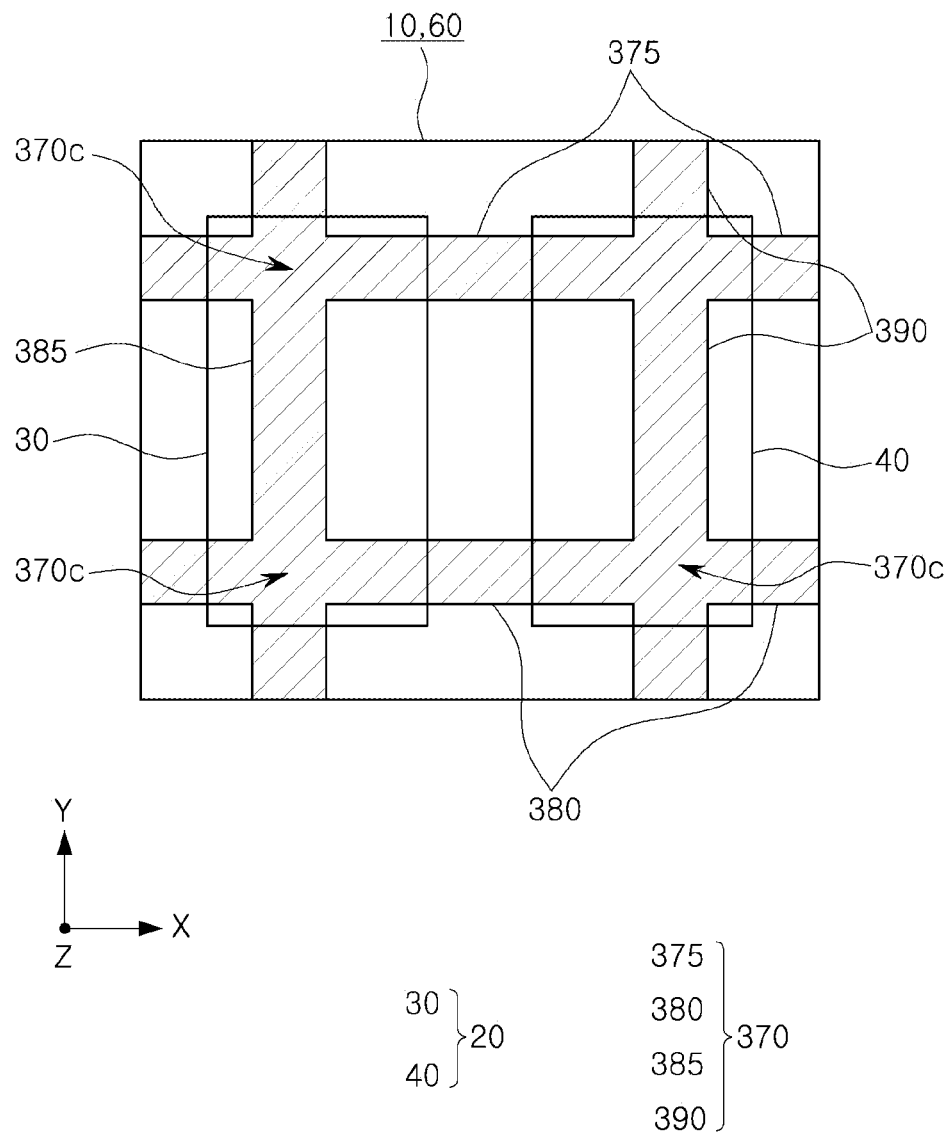
FIG. 7C is a plan view schematically illustrating a modified example of a semiconductor package according to some example embodiments of the present inventive concepts.

FIG. 7C is a plan view schematically illustrating a modified example of a semiconductor package according to some example embodiments of the present inventive concepts.

In a modified example, referring to FIG. 7C, a supporting structure 370 may include a first supporting portion 375 and a second supporting portion 380, parallel (e.g., extending in parallel) to each other and having a bar shape or a linear shape extending in the first horizontal direction X, and a third supporting portion 385 and a fourth supporting portion 390, parallel (e.g., extending in parallel) to each other and having a bar shape or a linear shape extending in the second horizontal direction Y.

As shown in at least FIG. 7C, the supporting structure 370 may include intersection regions 370c in which the first and second supporting portions 375 and 380 and the third and fourth supporting portions 385 and 390 intersect.

In some example embodiments, at least one of the intersection regions 370c may overlap at least one semiconductor chip structure of a plurality of semiconductor chip structures 20. For example, as shown in at least FIG. 7C, each semiconductor chip structure of the first semiconductor chip structure 30 and the second semiconductor chip structure 40 may overlap one or more intersection regions among the intersection regions 370c of the supporting structure 370 in the vertical direction Z. It will be understood that in some example embodiments the third supporting portion 385 and/or the fourth supporting portion 390 may be absent.

Figure 7D:
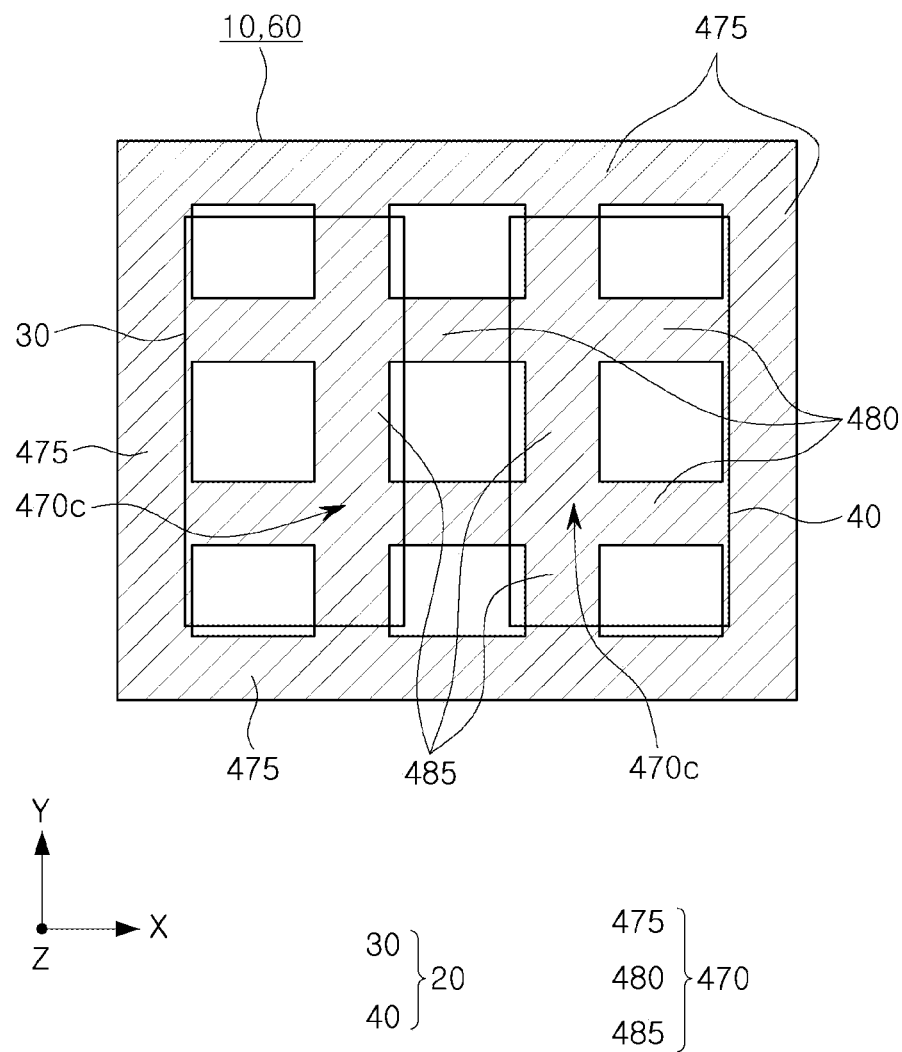
FIG. 7D is a plan view schematically illustrating a modified example of a semiconductor package according to some example embodiments of the present inventive concepts.

FIG. 7D is a plan view schematically illustrating a modified example of a semiconductor package according to some example embodiments of the present inventive concepts.

In a modified example, referring to FIG. 7D, a supporting structure 470 may include a first supporting portion 475 having a rectangular ring shape, one or plurality of second supporting portions 480 disposed inside the first supporting portion 475 and extending from the first supporting portion 475 in the first horizontal direction X, and one or plurality of third supporting portions 485 disposed inside the first supporting portion 475 and from the first supporting portion 475 extending in the second horizontal direction Y.

In some example embodiments, the one or plurality of second supporting portions 480 may be provided as a plurality of second supporting portions 480, parallel to each other.

In some example embodiments, the one or plurality of third supporting portions 485 may be provided as a plurality of third supporting portions 485, parallel to each other.

In some example embodiments, the supporting structure 470 may include one or plurality of intersection regions 470c in which the one or plurality of second supporting portions 480 and the one or plurality of third supporting portions 485 intersect.

Next, a modified example of the plurality of semiconductor chip structures 20 in FIG. 1 will be described with reference to FIG. 8.

Figure 8:
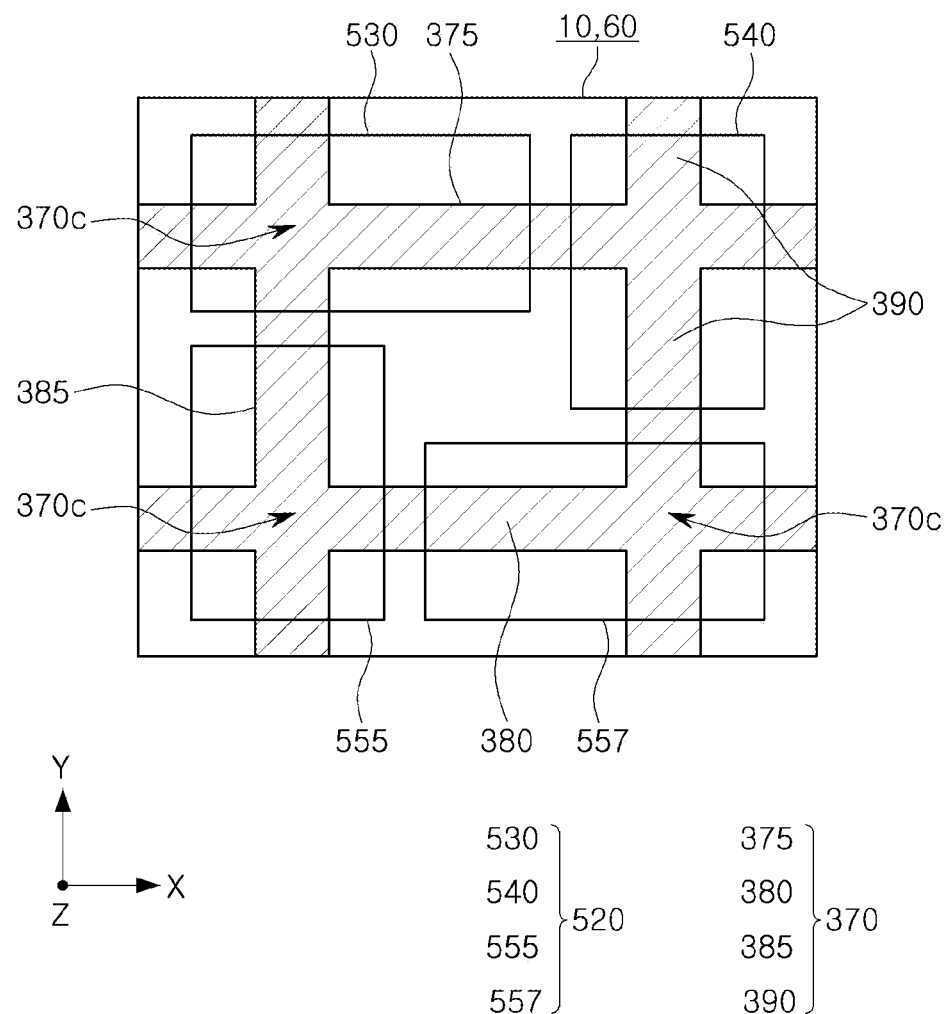
FIG. 8 is a plan view schematically illustrating a modified example of a semiconductor package according to some example embodiments of the present inventive concepts.

FIG. 8 is a plan view illustrating a modified example of the plurality of semiconductor chip structures 20 in FIG. 1.

In a modified example, referring to FIG. 8, a plurality of semiconductor chip structures 520 disposed on a substrate 10 may include a first semiconductor chip structure 530, a second semiconductor chip structure 540, a third semiconductor chip structure 555, and a fourth semiconductor chip structure 557.

The first and second semiconductor chip structures 530 and 540 may be spaced apart from each other (e.g., isolated from direct contact with each other) in the first horizontal direction X, and may be sequentially disposed. The third and fourth semiconductor chip structures 555 and 557 may be spaced apart from each other (e.g., isolated from direct contact with each other) in the first horizontal direction X, and may be sequentially disposed. The first and third semiconductor chip structures 530 and 555 may be spaced apart from each other (e.g., isolated from direct contact with each other) in the second horizontal direction Y, and may be sequentially disposed. The second and fourth semiconductor chip structures 540 and 557 may be spaced apart from each other (e.g., isolated from direct contact with each other) in the second horizontal direction Y, and may be sequentially disposed.

As shown in FIG. 8, the first supporting portion 375 may at least partially overlap both the first and second semiconductor chip structures 530 and 540 in the vertical direction Z, and the second supporting portion 380 may at least partially overlap both the third and fourth semiconductor chip structures 555, 557 in the vertical direction Z.

As shown in FIG. 8, the supporting structure 370 may further include, in addition to the first and second supporting portions 375 and 380, a third supporting portion 385 and a fourth supporting portion 390. Each of the third supporting portion 385 and the fourth supporting portion 390 may have a bar shape or a linear shape extending in the second horizontal direction Y. The third supporting portion 385 and the fourth supporting portion 390 may be connected to the first supporting portion 375 and the second supporting portion 380 (e.g., via intersection regions 370c). The first supporting portion 375 may overlap both the first semiconductor chip structure 530 and the second semiconductor chip structure 540 in the vertical direction Z. The second supporting portion 380 may overlap both the third semiconductor chip structure 555 and the fourth semiconductor chip structure 557 in the vertical direction Z. The third supporting portion 385 may overlap both the first semiconductor chip structure 530 and the third semiconductor chip structure 555 in the vertical direction Z. The fourth supporting portion 390 may overlap both the second semiconductor chip structure 540 and the fourth semiconductor chip structure 557 in the vertical direction Z.

A planar shape of a supporting structure may be the same as the supporting structure 70 in FIG. 1, or may be the same as any one of the supporting structures 170, 270, 370, and 470 in FIGS. 7A to 7D. For example, the supporting structure 370 described in FIG. 7C may be disposed. The intersection regions 370c of the supporting structure 370 described in FIG. 7C may overlap at least two or more semiconductor chip structures among the plurality of semiconductor chip structures 520. For example, at least a portion of the intersection regions 370c of the supporting structure 370 may overlap the first to fourth semiconductor chip structures 530, 540, 555, and 557.

Next, a modified example of a semiconductor package according to some example embodiments of the present inventive concepts will be described with reference to FIGS. 9, 10A, and 10B.

Figure 9:
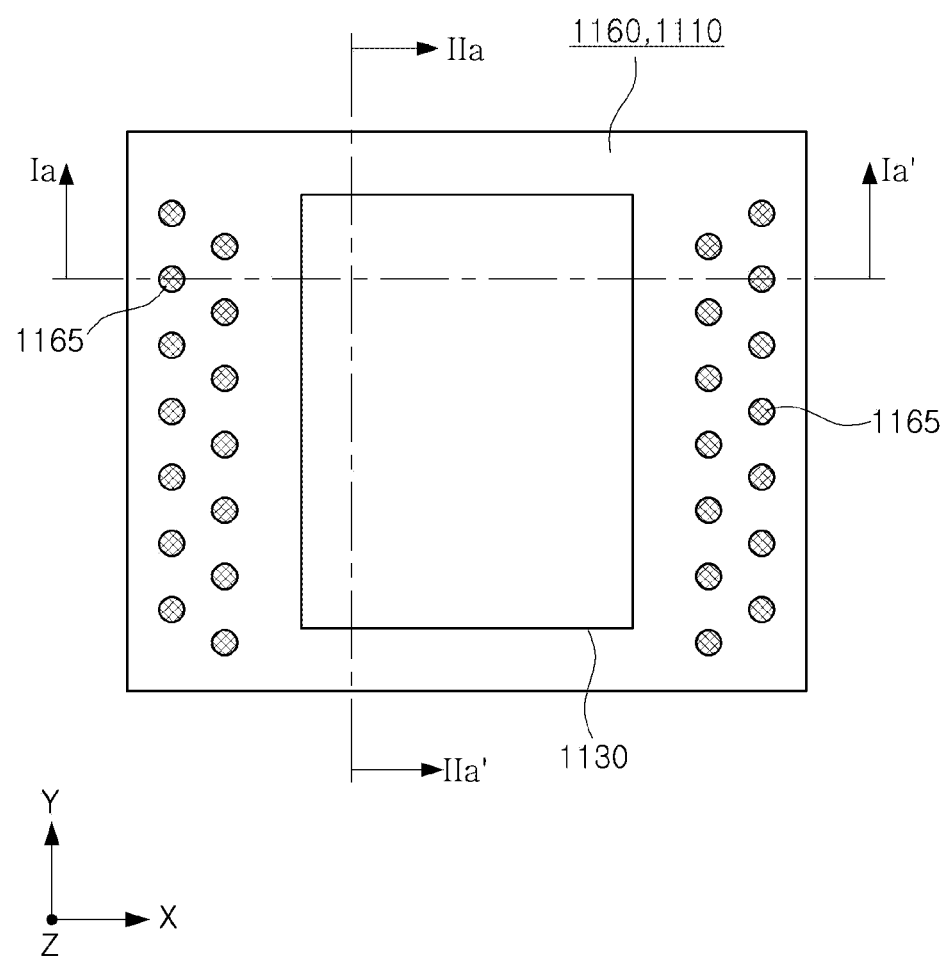
FIGS. 9, 10A, and 10B are views schematically illustrating a modified example of a semiconductor package according to some example embodiments of the present inventive concepts.
Figure 10A:
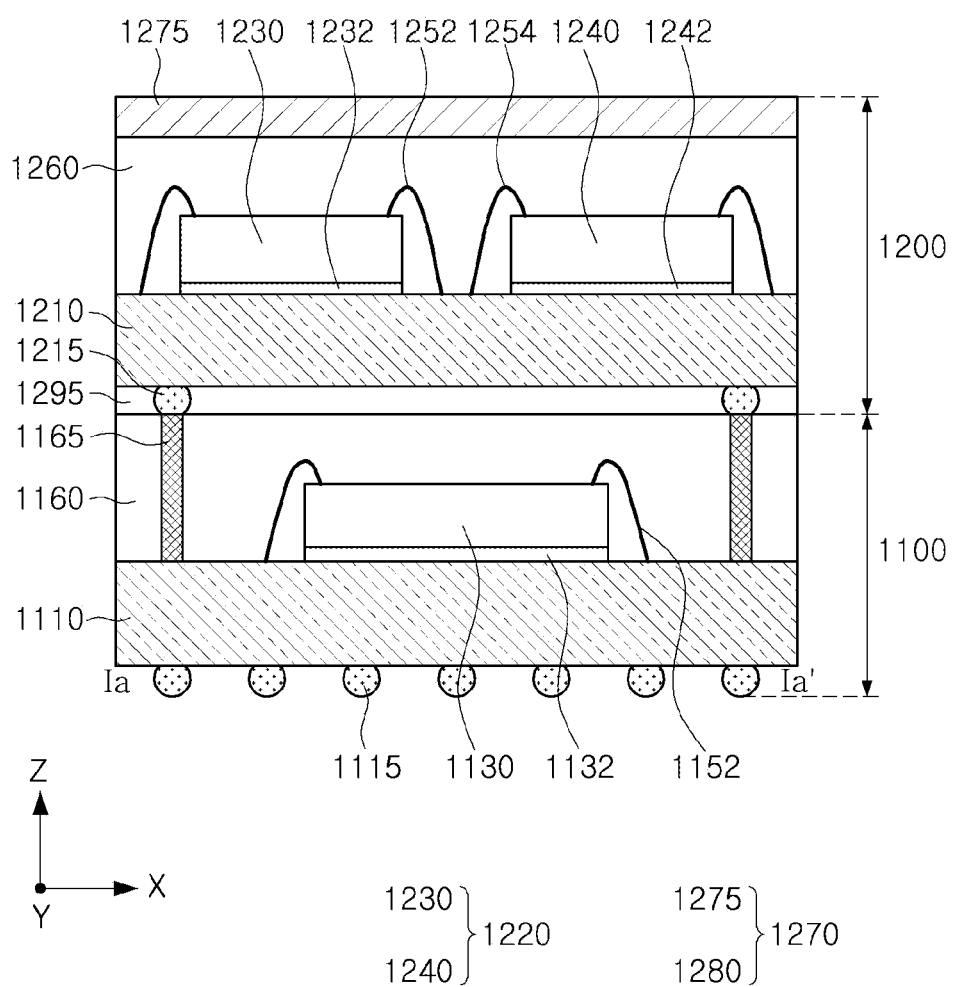
Figure 10B:
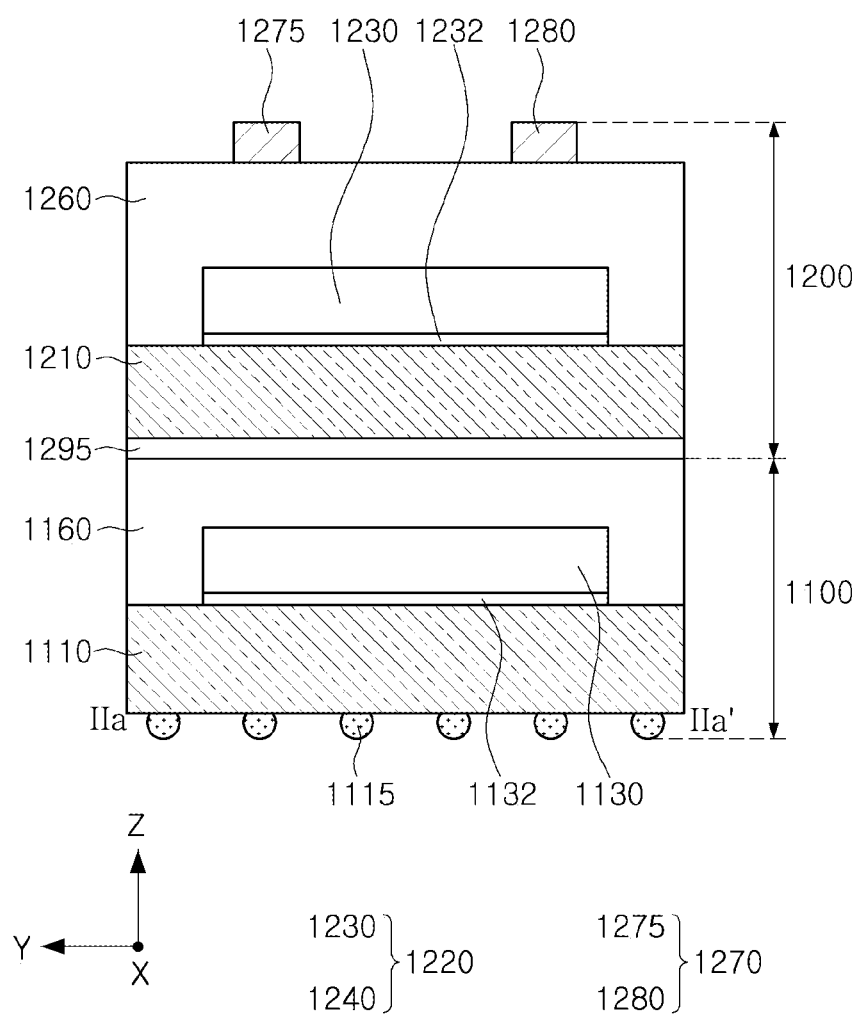

FIG. 9 is a plan view illustrating a portion of a semiconductor package according to some example embodiments of the present inventive concepts, FIG. 10A is a cross-sectional view illustrating of FIG. 9, taken along line Ia-Ia', and FIG. 10B is a cross-sectional view illustrating of FIG. 9, taken along line IIa-IIa'.

Referring to FIGS. 9, 10A, and 10B, a semiconductor package 1000a according to some example embodiments may include a lower semiconductor package 1100 and an upper semiconductor package 1200 on the lower semiconductor package 1100.

The lower semiconductor package 1100 may include a lower substrate 1110, one or plurality of lower semiconductor chips 1130 disposed on (e.g., directly or indirectly on) the lower substrate 1110, a lower mold layer 1160 disposed on the lower substrate 1110 and covering the one or plurality of lower semiconductor chips 1130, and lower connection patterns 1115 below the lower substrate 1110. It will be understood that "one or plurality of" structures may be referred to interchangeably as "one or more" of said structures.

In some example embodiments, the lower semiconductor package 1100 may further include connection conductive patterns 1165 on (e.g., directly or indirectly on) the lower substrate 1110 and passing through the lower mold layer 1160 and electrically connected to the lower substrate 1110. Each of the connection conductive patterns 1165 may be formed of a single conductive pillar or a plurality of conductive patterns stacked in the vertical direction Z.

In some example embodiments, the one or plurality of lower semiconductor chips 1130 may be mounted on the lower substrate 1110 in various ways. For example, below the one or plurality of lower semiconductor chips 1130, an adhesive layer 1132 may be disposed, and a connection structure 1152 having a bonding wire structure electrically connecting the one or plurality of lower semiconductor chips 1130 and the lower substrate 1110 may be disposed. In another example, the one or plurality of lower semiconductor chips 1130 may be mounted on the lower substrate 1110 to have a flip chip form.

The upper semiconductor package 1200, which may correspond to semiconductor packages of any of the example embodiments (e.g., semiconductor package 1) may include an upper substrate 1210, a plurality of upper semiconductor chip structures 1220 disposed on the upper substrate 1210, an upper mold layer 1260 disposed on the upper substrate 1210 and covering the plurality of upper semiconductor chip structures 1220, intermediate connection patterns 1215 disposed below the upper substrate 1210, and a supporting structure 1270 disposed on the upper mold layer 1260. The intermediate connection patterns 1215, which may electrically connect the lower semiconductor package 1100 and the upper substrate 1210 (e.g., in combination with the connection conductive patterns 1165), may be conductive bumps, for example solder bumps, electrically connecting the upper substrate 1210 and the connection conductive patterns 1165. As shown, the intermediate connection patterns 1215 may be in direct contact with corresponding connection conductive patterns 1165.

In some example embodiments, an underfill material layer 1295 may be disposed between the lower semiconductor package 1100 and the upper substrate 1210 and surrounding lateral surfaces of the intermediate connection patterns 1215. In another example, the underfill material layer 1295 may be omitted.

In some example embodiments, the upper substrate 1210 may be substantially the same as the substrate 10 described in FIGS. 1, 2A, and 2B, the upper mold layer 1260 may be substantially the same as the mold layer 60 illustrated in FIGS. 1, 2A, and 2B, and the plurality of upper semiconductor chip structures 1220 may be substantially the same as the plurality of semiconductor chip structures 20 described in FIGS. 1, 2A, and 2B. For example, the plurality of upper semiconductor chip structures 1220 may include a first upper semiconductor chip structure 1230 and a second upper semiconductor chip structure 1240, corresponding to the first semiconductor chip structure 30 and the second semiconductor chip structure 40 described in FIGS. 1, 2A, and 2B, respectively and electrically connected to the upper substrate 1210 via first and second connection structures 1252 and 1254 (e.g., bonding wires), respectively. The upper semiconductor package 1200 may further include a first adhesive layer 1232 bonding the first upper semiconductor chip structure 1230 and the upper substrate 1210, and a second adhesive layer 1242 bonding the second upper semiconductor chip structure 1240 and the upper substrate 1210.

In another example, at least one of the first upper semiconductor chip structure 1230 or the second upper semiconductor chip structure 1240 may be any one of the first stacked chip structures 130, 230, 330, or 430, described in FIGS. 6B, 6C, 6D, and 6E.

In some example embodiments, the supporting structure 1270 may be substantially the same as the supporting structure 70 described in FIGS. 1, 2A, and 2B.

In another example, supporting portions 1275 and 1280 of the supporting structure 1270 may have side profiles substantially the same as side profiles of the first and second supporting portions 75 and 80 described in FIGS. 3A and 3B, respectively.

In another example, a planar shape of the supporting structure 1270 may be transformed into a planar shape that may be substantially the same as any one of the supporting structures 170, 270, 370, or 470 described in FIGS. 7A to 7D.

Next, another modified example of a semiconductor package according to some example embodiments of the present inventive concepts will be described with reference to FIGS. 11, 12A, and 12B.

Figure 11:
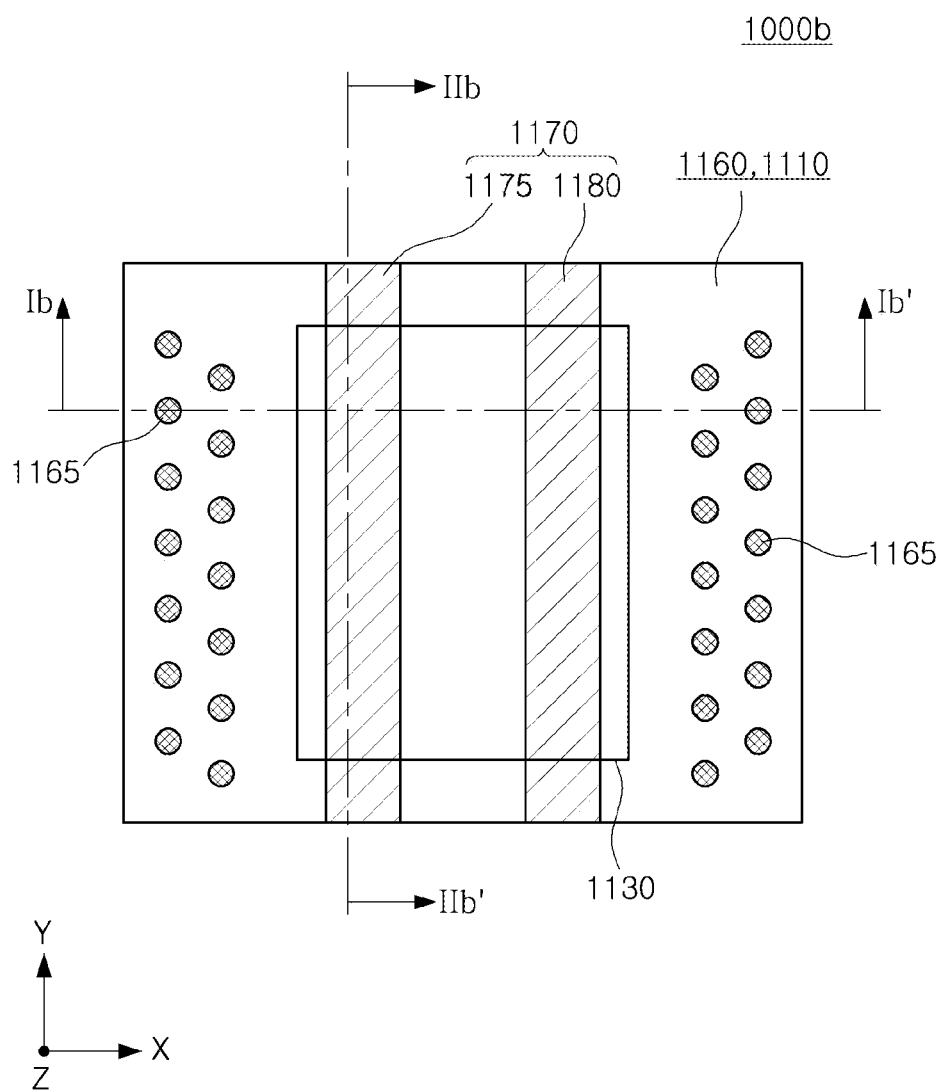
FIGS. 11, 12A, and 12B are views schematically illustrating a modified example of a semiconductor package according to some example embodiments of the present inventive concepts.
Figure 12A:
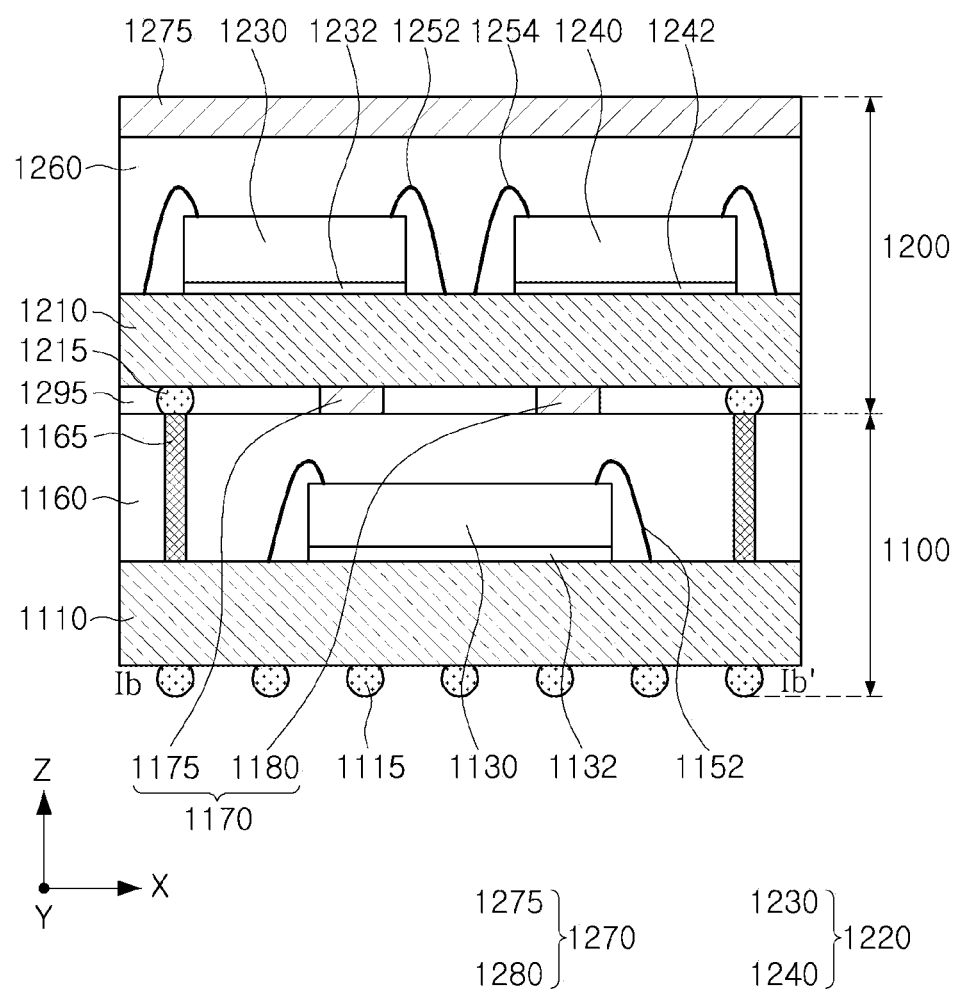
Figure 12B:
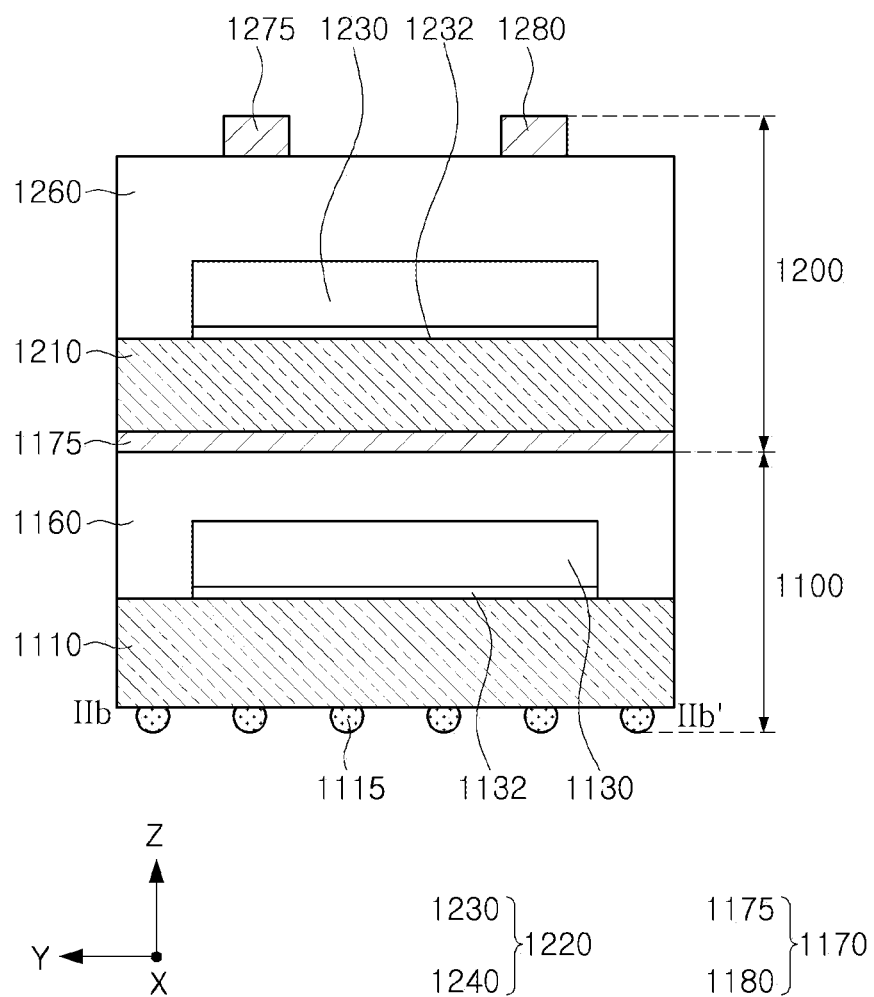

FIG. 11 is a plan view illustrating a portion of a semiconductor package according to some example embodiments of the present inventive concepts, FIG. 12A is a cross-sectional view illustrating FIG. 11, taken along line Ib-Ib', and FIG. 12B is a cross-sectional view illustrating FIG. 11, taken along line IIb-IIb'.

Referring to FIGS. 11, 12A, and 12B, a semiconductor package 1000b according to some example embodiments may include the lower semiconductor package 1100 and the upper semiconductor package 1200, substantially identical to those described with reference to FIGS. 9, 10A, and 10B. The semiconductor package 1000*b* may further include a lower supporting structure 1170 disposed on the lower semiconductor package 1100.

In some example embodiments, the lower supporting structure 1170 may include first and second lower supporting portions 1175 and 1180 extending in any one of the horizontal directions, for example, in the second horizontal direction Y. Each of the first and second lower supporting portions 1175 and 1180 may have a bar shape or a linear shape. The lower supporting structure 1170 may include substantially the same material as the supporting structure 70 described in FIGS. 1, 2A, and 2B.

Next, an example of a method of forming a semiconductor package according to some example embodiments of the present inventive concepts will be described with reference to FIGS. 13A to 14B.

Figure 13A:
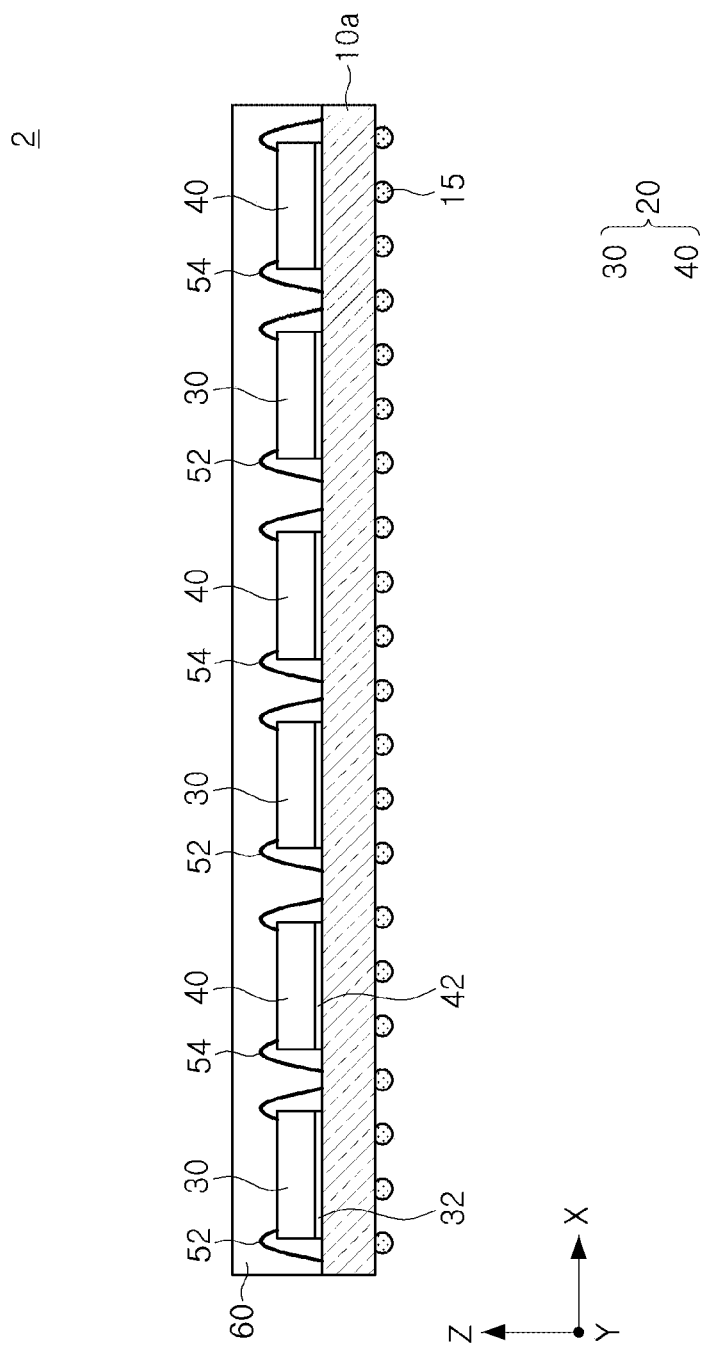
FIGS. 13A, 13B, 14A, and 14B are cross-sectional views schematically illustrating a method of manufacturing a semiconductor package according to some example embodiments of the present inventive concepts.
Figure 13B:
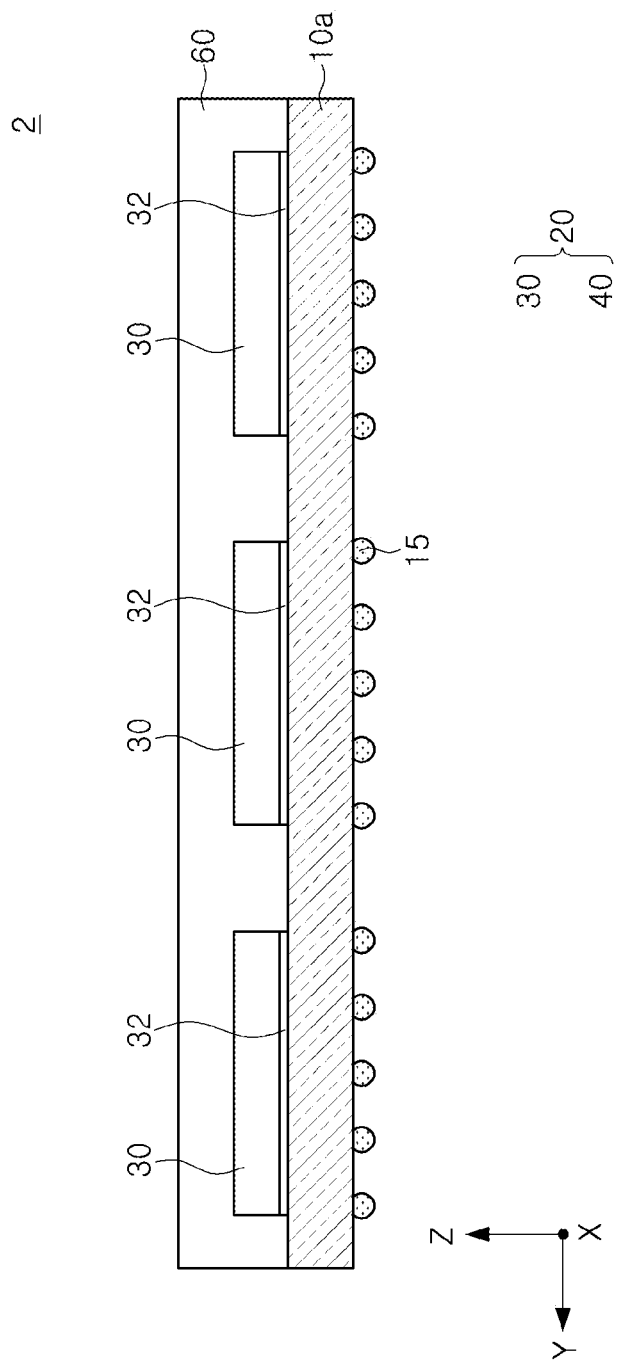
Figure 14A:
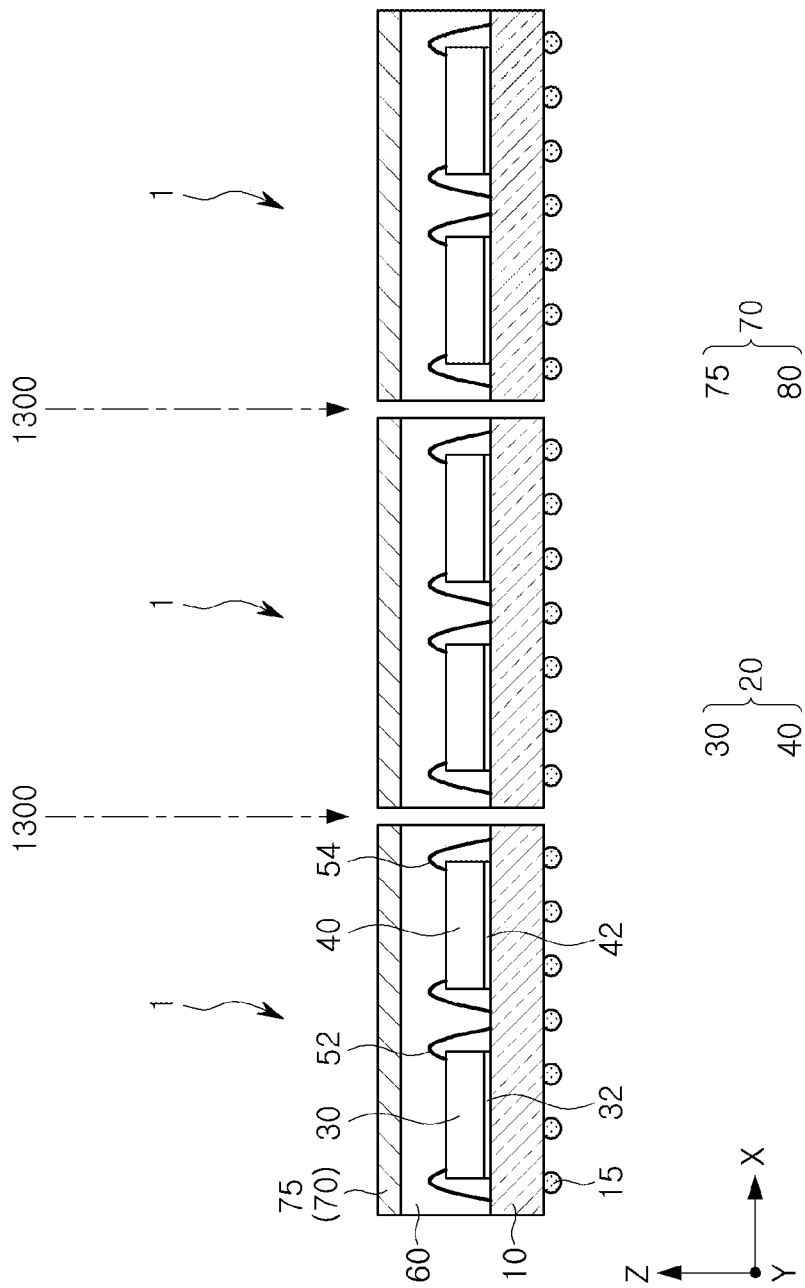
Figure 14B:
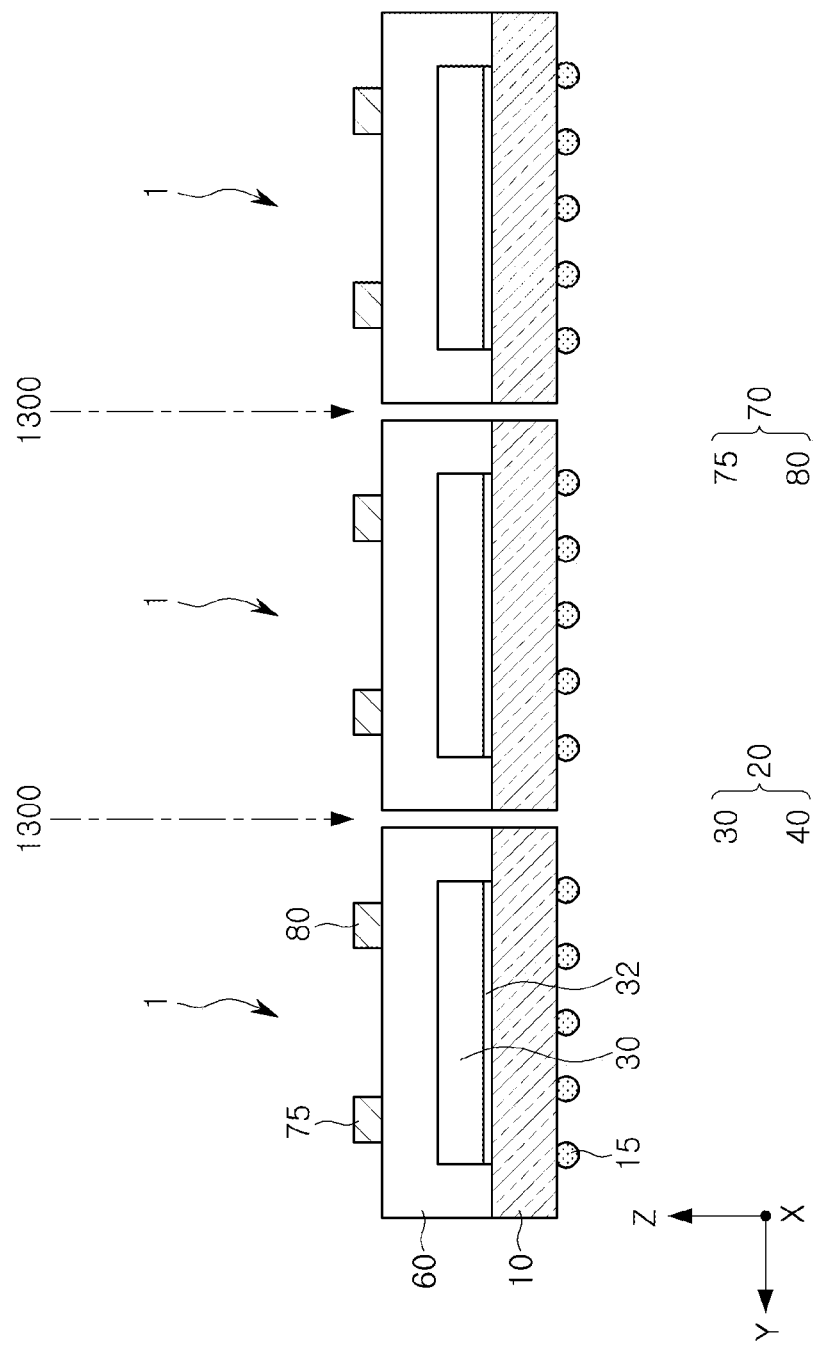

FIGS. 13A, 13B, 14A, and 14B are cross-sectional views schematically illustrating a method of manufacturing a semiconductor package according to some example embodiments of the present inventive concepts. FIGS. 13A and 14A are cross-sectional views taken in the first horizontal direction X, and FIGS. 13B and 14B are cross-sectional views taken in the second horizontal direction Y.

First, referring to FIGS. 13A and 13B, a package preliminary structure 2 including a base 10*a*, a plurality of semiconductor chip structures 20 mounted on the base 10*a*, a mold layer 60 disposed on the base 10*a* and covering the plurality of semiconductor chip structures 20, and lower connection patterns 15 formed below the base 10*a* may be formed. The base 10*a* may be a printed circuit board.

When the plurality of semiconductor chip structures 20 is mounted on the base 10*a* by a wire bonding process, adhesive layers 32 and 42 may be formed below each of the plurality of semiconductor chip structures 20. Then, the plurality of semiconductor chip structures 20 on which the adhesive layers 32 and 42 are formed may be attached to the base 10*a*, and a wire bonding process may be performed, to form connection structures 52 and 54, electrically connecting the plurality of semiconductor chip structures 20 and the base 10*a*.

In some example embodiments, the plurality of semiconductor chip structures 20 may include a first semiconductor chip structure 30 and a second semiconductor chip structure 40, spaced apart from each other, as illustrated in FIGS. 1 and 2A to 2B. The first semiconductor chip structure 30 and the second semiconductor chip structure 40, spaced apart from each other, may be provided in plural, and may be disposed in the first horizontal direction X and the second horizontal direction Y.

In another example, the plurality of semiconductor chip structures 20 may be mounted on the base 10*a* to have a flip chip form, as illustrated in FIG. 6A.

In another example, the first semiconductor chip structure 30 of the plurality of semiconductor chip structures 20 may be formed as any one of first stacked chip structures 130, 230, 330, or 430, as described in FIGS. 6B, 6C, 6D and 6E, and the second semiconductor chip structure 40 may be formed as any one of second stacked chip structures 140, 240, 340, or 440, as described in FIGS. 6B, 6C, 6D, and 6E.

Referring to FIGS. 14A and 14B, a supporting structure 70 may be formed on the mold layer 60 of the package preliminary structure 2. Subsequently, a cutting process 1300 of cutting and separating the package preliminary structure 2 and the supporting structure 70 (e.g., via operation of a cutting blade, cutting laser beam, or the like) may be performed to form a plurality of semiconductor packages 1.

In some example embodiments, the formation of the supporting structure 70 may include forming a supporting layer on the mold layer 60, and patterning the supporting layer.

In another example, the formation of the supporting structure 70 may include forming a sacrificial layer having an opening on the mold layer 60, forming a supporting layer in the opening of the sacrificial layer, and removing the sacrificial layer.

In another example, the formation of the supporting structure 70 may include etching a portion of the mold layer 60 to form a groove, and forming a supporting layer filling the groove.

According to some example embodiments of the present inventive concepts, a semiconductor package including a supporting structure capable of controlling warpage may be provided. Since such a supporting structure may control the warpage of the semiconductor package, deformation of the semiconductor package may be reduced or minimized. Therefore, reliability of the semiconductor package may be improved.

Various advantages and effects of the present inventive concepts are not limited to the above descriptions, and can be more easily understood in describing specific embodiments of the present inventive concepts.

While example embodiments have been illustrated and described above, it will be apparent to those skilled in the art that modifications and variations could be made without departing from the scope of the present inventive concepts as defined by the appended claims.

What is claimed is:

1. A semiconductor package, comprising:
   a substrate;
   a first semiconductor chip structure on the substrate and a second semiconductor chip structure on the substrate, the first semiconductor chip structure and the second semiconductor chip structure being spaced apart from each other in a first horizontal direction that is parallel to an upper surface of the substrate;
   a mold layer on the substrate, the mold layer covering both the first semiconductor chip structure and the second semiconductor chip structure;
   a supporting structure on the mold layer, the supporting structure distal from the upper surface of the substrate than both the first semiconductor chip structure and the second semiconductor chip structure in a vertical direction that is perpendicular to the upper surface of the substrate, the supporting structure being in direct contact with the mold layer;
   a lower semiconductor package; and
   conductive bumps electrically connecting the lower semiconductor package and the substrate,
   wherein the lower semiconductor package includes a lower substrate, one or more lower semiconductor chips on the lower substrate, and connection conductive patterns on the lower substrate and electrically connected to the conductive bumps,
   wherein the supporting structure includes a first supporting structure and a second supporting structure, the first supporting structure and the second supporting structure being spaced apart from each other in a second horizontal direction that is parallel to the upper surface of the substrate, and further is perpendicular to the first horizontal direction, wherein each of the first supporting structure and the second supporting structure has a first bar shape or a first linear shape extending in the first horizontal direction, and wherein at least one of the first supporting structure or the second supporting structure overlaps the first and second semiconductor chip structures in the vertical direction.

2. The semiconductor package of claim 1, wherein each of the first supporting structure and the second supporting structure includes
   a first lateral surface and a second lateral surface that are opposite to each other, and
   a third lateral surface and a fourth lateral surface that are opposite to each other,
the first and second lateral surfaces of the first and second supporting structures are parallel to the second horizontal direction,
the third and fourth lateral surfaces of the first and second supporting structures are parallel to the first horizontal direction, and
the first and second lateral surfaces of the first and second supporting structures are each coplanar with a portion of one or more lateral surfaces of the mold layer in the vertical direction.

3. The semiconductor package of claim 2, wherein
the mold layer has a first lateral surface and a second lateral surface that are opposite to each other,
a portion of the first lateral surface of the mold layer is coplanar with the first lateral surfaces of the first and second supporting structures in the vertical direction,
a portion of the second lateral surface of the mold layer is coplanar with the second lateral surfaces of the first and second supporting structures in the vertical direction,
the first lateral surface of the mold layer is closer than the second lateral surface of the mold layer to the first semiconductor chip structure, and the second lateral surface of the mold layer is closer than the first lateral surface of the mold layer to the second semiconductor chip structure, and
a distance between the first semiconductor chip structure and the second semiconductor chip structure in the first horizontal direction is greater than a smallest distance between the first lateral surface of the mold layer and the first semiconductor chip structure in the first horizontal direction.

4. The semiconductor package of claim 1, wherein at least one semiconductor chip structure of the first semiconductor chip structure or the second semiconductor chip structure has a rectangular prism shape wherein a length of the at least one semiconductor chip structure in the second horizontal direction is greater than a length of the at least one semiconductor chip structure in the first horizontal direction.

5. The semiconductor package of claim 1, wherein the mold layer has an outer shape wherein a length of the mold layer in the first horizontal direction is greater than a length of the mold layer in the second horizontal direction.

6. The semiconductor package of claim 1, wherein the supporting structure comprises a copper material.

7. The semiconductor package of claim 1, wherein a thickness of the supporting structure in the vertical direction is less than a thickness of the mold layer in the vertical direction.

8. The semiconductor package of claim 1, wherein at least one of the first semiconductor chip structure or the second semiconductor chip structure is a single semiconductor chip.

9. The semiconductor package of claim 1, wherein at least one of the first semiconductor chip structure or the second semiconductor chip structure is a stacked chip structure including a plurality of semiconductor chips stacked in the vertical direction.

10. The semiconductor package of claim 1, wherein
the supporting structure further includes one or more third supporting structures,
wherein the one or more third supporting structures each have a second bar shape or a second linear shape extending in the second horizontal direction,
the supporting structure includes intersection regions in which the first and second supporting structures and the one or more third supporting structures intersect,
each semiconductor chip structure of the first semiconductor chip structure and the second semiconductor chip structure overlaps one or more intersection regions among the intersection regions of the supporting structure in the vertical direction.

11. A semiconductor package, comprising:
a substrate;
one or more semiconductor chip structures on the substrate;
a mold layer on the substrate and covering the one or more semiconductor chip structures; and
a supporting structure contacting an upper surface of the mold layer, the supporting structure being distal from the upper surface of the substrate than the one or more semiconductor chip structures in a vertical direction that is perpendicular to the upper surface of the substrate,
wherein the supporting structure includes a first supporting structure and a second supporting structure, the first supporting structure and the second supporting structure extending in parallel to each other and are spaced apart from each other,
wherein each of the first supporting structure and the second supporting structure has a first bar shape or a first linear shape extending in a first horizontal direction that is parallel to the upper surface of the substrate,
wherein a length of each of the first supporting structure and the second supporting structure in the first horizontal direction is a same length as a length of the mold layer in the first horizontal direction,
wherein the supporting structure is embedded in the mold layer, and
wherein an upper surface of the supporting structure in the vertical direction is coplanar with the upper surface of the mold layer in the vertical direction.

12. The semiconductor package of claim 11, wherein
the one or more semiconductor chip structures are a plurality of semiconductor chip structures,
the plurality of semiconductor chip structures includes a first semiconductor chip structure and a second semiconductor chip structure, the first semiconductor chip structure and the second semiconductor chip structure being spaced apart from each other in the first horizontal direction,
at least one semiconductor chip structure of the first semiconductor chip structure or the second semiconductor chip structure has a rectangular prism shape wherein a length of the at least one semiconductor chip structure in a second horizontal direction is greater than a length of the at least one semiconductor chip structure in the first horizontal direction, the second horizontal direction is perpendicular to the first horizontal direction and is perpendicular to the vertical direction, and at least one of the first supporting structure or the second supporting structure overlaps both the first semiconductor chip structure and the second semiconductor chip structure in the vertical direction.

13. The semiconductor package of claim 12, wherein
the plurality of semiconductor chip structures further includes
   a third semiconductor chip structure that is spaced apart from the first semiconductor chip structure in the second horizontal direction, and
   a fourth semiconductor chip structure that is spaced apart from the second semiconductor chip structure in the second horizontal direction,
the first supporting structure overlaps both the first semiconductor chip structure and the second semiconductor chip structure in the vertical direction, and
the second supporting structure overlaps both the third semiconductor chip structure and the fourth semiconductor chip structure in the vertical direction.

14. The semiconductor package of claim 13, wherein
the supporting structure further includes a third supporting structure and a fourth supporting structure,
each of the third supporting structure and the fourth supporting structure has a second bar shape or a second linear shape extending in the second horizontal direction,
the third supporting structure and the fourth supporting structure are connected to the first supporting structure and the second supporting structure,
the third supporting structure overlaps both the first semiconductor chip structure and the third semiconductor chip structure in the vertical direction, and
the fourth supporting structure overlaps both the second semiconductor chip structure and the fourth semiconductor chip structure in the vertical direction.

15. The semiconductor package of claim 11, further comprising:
a lower semiconductor package; and
conductive bumps electrically connecting the lower semiconductor package and the substrate,
wherein the lower semiconductor package includes a lower substrate, one or more lower semiconductor chips on the lower substrate, and connection conductive patterns on the lower substrate and electrically connected to the conductive bumps.

16. A semiconductor package, comprising:
a substrate;
a first semiconductor chip on the substrate and a second semiconductor chip on the substrate, the first semiconductor chip and the second semiconductor chip being spaced apart from each other in a first horizontal direction that is parallel to an upper surface of the substrate;
a mold layer on the substrate, the mold layer covering both the first semiconductor chip and the second semiconductor chip; and
a supporting structure overlapping both the first semiconductor chip and the second semiconductor chip in a vertical direction that is perpendicular to the upper surface of the substrate, the supporting structure being in direct contact with the mold layer,
wherein the supporting structure includes a first supporting structure having a first length in the first horizontal direction and a second length in a second horizontal direction, the second length being less than the first length, the second horizontal direction being perpendicular to both the first horizontal direction and the vertical direction,
wherein the second length of the first supporting structure in the second horizontal direction is equal to or greater than about 10 µM, and the second length of the first supporting structure in the second horizontal direction is equal to or less than one-half of a length of the substrate in the second horizontal direction,
wherein the supporting structure further includes a second supporting structure that is parallel to the first supporting structure,
wherein each of the first supporting structure and the second supporting structure has an inclined lateral surface,
wherein each of the first supporting structure and the second supporting structure includes an upper surface having a first width in the second horizontal direction and a lower surface having a second width in the second horizontal direction, and
wherein the second width is greater than the first width.

17. The semiconductor package of claim 16, wherein
a thickness of the substrate in the vertical direction is equal to or greater than about 60 µm and equal to or less than about 250 µm,
a thickness of the mold layer in the vertical direction is equal to or greater than about 250 µm and equal to or less than about 650 µm, and
a distance between an upper surface of at least one of the first semiconductor chip or the second semiconductor chip and the upper surface of the mold layer in the vertical direction is equal to or greater than about 80 µM and equal to or less than about 300 µm.

18. The semiconductor package of claim 17, wherein a thickness of the supporting structure in the vertical direction is equal to or greater than about 5 µm and equal to or less than about 200 µm.

19. The semiconductor package of claim 16, wherein
the substrate comprises a first material having a first glass transition temperature of about 150° C. to about 300° C.,
the first material has a coefficient of thermal expansion of about 5 ppm/° C. to about 200 ppm/° C. before the first glass transition temperature and a coefficient of thermal expansion of about 1 ppm/° C. to about 200 ppm/° C. after the first glass transition temperature,
the mold layer includes a second material having a second glass transition temperature of about 100° C. to about 170° C.,
the second material has a coefficient of thermal expansion of about 5 ppm/° C. to about 200 ppm/° C. before the second glass transition temperature, and a coefficient of thermal expansion of about 1 ppm/° C. to about 200 ppm/° C. after the second glass transition temperature, and
the supporting structure includes a material having an elastic modulus value of about 50 GPa to about 450 GPa.

20. The semiconductor package of claim 16, further comprising:
a lower semiconductor package; and
conductive bumps electrically connecting the lower semiconductor package and the substrate,
wherein the lower semiconductor package includes a lower substrate, one or more lower semiconductor chips on the lower substrate, and connection conductive patterns on the lower substrate and electrically connected to the conductive bumps.

* * * * *